(12) United States Patent
Kim et al.

(10) Patent No.: US 11,532,800 B2
(45) Date of Patent: Dec. 20, 2022

(54) LIGHT EMITTING DEVICE, METHOD OF MANUFACTURING THE SAME, AND DISPLAY DEVICE

(71) Applicant: SAMSUNG ELECTRONICS CO., LTD., Suwon-si (KR)

(72) Inventors: Chan Su Kim, Seoul (KR); Kun Su Park, Seongnam-si (KR); Tae Ho Kim, Seongnam-si (KR); Eun Joo Jang, Suwon-si (KR); Dae Young Chung, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 161 days.

(21) Appl. No.: 17/008,779

(22) Filed: Sep. 1, 2020

(65) Prior Publication Data

US 2021/0091325 A1    Mar. 25, 2021

(30) Foreign Application Priority Data

Sep. 23, 2019 (KR) .................. 10-2019-0116948

(51) Int. Cl.
*H01L 51/50* (2006.01)
*H01L 51/56* (2006.01)
*H01L 51/00* (2006.01)

(52) U.S. Cl.
CPC ........ *H01L 51/502* (2013.01); *H01L 51/0005* (2013.01); *H01L 51/506* (2013.01); *H01L 51/5056* (2013.01); *H01L 51/5064* (2013.01); *H01L 51/56* (2013.01); *H01L 2251/5369* (2013.01)

(58) Field of Classification Search
CPC ....................................... H01L 51/5048–5096
See application file for complete search history.

(56) References Cited

U.S. PATENT DOCUMENTS

| | | | | |
|---|---|---|---|---|
| 10,003,037 | B2* | 6/2018 | Luchinger | ........... H01L 51/0004 |
| 10,050,220 | B2* | 8/2018 | Xu | ........... H01L 51/502 |
| 11,171,291 | B2* | 11/2021 | Yoon | ........... H01L 51/0067 |

(Continued)

FOREIGN PATENT DOCUMENTS

| | | | | |
|---|---|---|---|---|
| CN | 103840047 A | * | 6/2014 | ............. H01L 51/56 |
| CN | 107492587 A | * | 12/2017 | ............. H01L 27/15 |

(Continued)

OTHER PUBLICATIONS

Machine translation, Lee, WIPO Pat. Pub. No. WO-2020130592-A1, translation date: Apr. 6, 2022, Clarivate Analytics, all pages. (Year: 2022).*

(Continued)

*Primary Examiner* — Victoria K. Hall
(74) *Attorney, Agent, or Firm* — Cantor Colburn LLP

(57) ABSTRACT

A light emitting device including a first electrode, a second electrode, a quantum dot layer disposed between the first electrode and the second electrode and a first auxiliary layer disposed between the quantum dot layer and the first electrode, wherein the first auxiliary layer includes nickel oxide nanoparticles having an average particle diameter of less than or equal to about 10 nanometers (nm) and an organic ligand, a method of manufacturing the light emitting device, and a display device including the same.

22 Claims, 9 Drawing Sheets

(56) References Cited

U.S. PATENT DOCUMENTS

| | | | | |
|---|---|---|---|---|
| 2006/0245998 | A1* | 11/2006 | Kahn | C01G 9/02 423/592.1 |
| 2006/0289838 | A1* | 12/2006 | Yoon | H01G 4/0085 252/500 |
| 2014/0367721 | A1* | 12/2014 | Mahler | G02F 1/133603 977/773 |
| 2016/0356456 | A1* | 12/2016 | Mahler | H01L 33/32 |
| 2018/0019371 | A1* | 1/2018 | Steckel | H01L 33/502 |
| 2018/0033984 | A1* | 2/2018 | Luchinger | H01L 51/5048 |
| 2019/0115556 | A1* | 4/2019 | Lee | H01L 27/3246 |
| 2021/0066634 | A1* | 3/2021 | Park | H01L 51/5092 |
| 2021/0234100 | A1* | 7/2021 | Jin | C01G 53/04 |
| 2022/0102660 | A1* | 3/2022 | Lee | H01L 51/0003 |
| 2022/0238830 | A1* | 7/2022 | Ueta | H01L 51/502 |

FOREIGN PATENT DOCUMENTS

| | | | | | |
|---|---|---|---|---|---|
| CN | 108529690 | A | * | 9/2018 | H01L 51/56 |
| CN | 106966441 | A | * | 11/2018 | C01G 53/04 |
| CN | 109803974 | A | * | 5/2019 | C23C 16/406 |
| CN | 109980129 | A | * | 7/2019 | H01L 51/56 |
| CN | 111223998 | A | * | 6/2020 | H01L 51/502 |
| CN | 111384272 | A | * | 7/2020 | H01L 51/502 |
| CN | 111384301 | A | * | 7/2020 | H01L 51/56 |
| JP | 2000-345202 | A | * | 12/2000 | B22F 1/00 |
| KR | 20170117466 | A | | 10/2017 | |
| KR | 20190028460 | A | | 3/2019 | |
| WO | WO-2020130592 | A1 | * | 6/2020 | C08L 65/00 |

OTHER PUBLICATIONS

Machine translation, Liang, Chinese Pat. Pub. No. CN-111384272-A, translation date: Apr. 6, 2022, Clarivate Analytics, all pages. (Year: 2022).*

Machine translation, Liang, Chinese Pat. Pub. No. CN-111223998-A, translation date: Apr. 6, 2022, Clarivate Analytics, all pages. (Year: 2022).*

Machine translation, Liu, Chinese Pat. Pub. No. CN-108529690-A, translation date: Apr. 6, 2022, Clarivate Analytics, all pages. (Year: 2022).*

Machine translation, Jin, Chinese Pat. Pub. No. CN-106966441-A, translation date: Apr. 6, 2022, Espacenet, all pages. (Year: 2022).*

Machine translation, Wu, Chinese Pat. Pub. No. CN-109980129-A, translation date: Apr. 6, 2022, Espacenet, all pages. (Year: 2022).*

Machine translation, Araki, Japanese Pat. Pub. No. JP-2000-345202A, translation date: Apr. 6, 2022, Espacenet, all pages. (Year: 2022).*

Machine translation, Jin, Chinese Pat. Pub. No. CN-103840047-A, translation date: Apr. 6, 2022, Clarivate Analytics, all pages. (Year: 2022).*

Machine translation, Liu, Chinese Pat. Pub. No. CN-107492587-A, translation date: Apr. 6, 2022, Clarivate Analytics, all pages. (Year: 2022).*

Machine translation, Wang, Chinese Pat. Pub. No. CN-111384301-A, translation date: Apr. 6, 2022, Clarivate Analytics, all pages. (Year: 2022).*

Machine translation, Xi, Chinese Pat. Pub. No. CN-109803974-A, translation date: Apr. 6, 2022, Clarivate Analytics, all pages. (Year: 2022).*

* cited by examiner

LIGHT EMITTING DEVICE, METHOD OF MANUFACTURING THE SAME, AND DISPLAY DEVICE

CROSS-REFERENCE TO RELATED APPLICATION

This application claims priority to and the benefit of Korean Patent Application No. 10-2019-0116948 filed in the Korean Intellectual Property Office on Sep. 23, 2019, and all the benefits accruing therefrom under 35 U.S.C. § 119, the content of which in its entirety is herein incorporated by reference.

BACKGROUND

1. Field

A light emitting device, a method of manufacturing the light emitting device, and a display device including the light emitting device are disclosed.

2. Description of the Related Art

Physical characteristics (e.g., bandgap energies and melting points) of nanoparticles that are intrinsic characteristics may be controlled by changing the particle size of the nanoparticles, unlike bulk materials. For example, semiconductor nanocrystals also known as quantum dots may be supplied with photoenergy or electrical energy and may emit light in a wavelength corresponding to sizes of the quantum dots. Accordingly, quantum dots may be used as a light emitting element emitting light of a particular wavelength.

SUMMARY

A quantum dot device may use quantum dots as a light emitting body. A method of improving performance of the light emitting device using quantum dots as a light emitting body is desired.

An embodiment provides a light emitting device capable of realizing improved performance.

An embodiment provides a method of manufacturing the light emitting device.

An embodiment provides a display device including the light emitting device.

According to an embodiment, a light emitting device includes a first electrode, a second electrode, a quantum dot layer disposed between the first electrode and the second electrode, and a first auxiliary layer disposed between the quantum dot layer and the first electrode, wherein the first auxiliary layer includes nickel oxide nanoparticles having an average particle diameter of less than or equal to about 10 nanometers (nm) and an organic ligand.

The average particle diameter of the nickel oxide nanoparticles may be less than about 5 nm.

About 90% or greater of a total number of the nickel oxide nanoparticles in the first auxiliary layer may have a particle size within ±about 30% of the average particle diameter of the nickel oxide nanoparticles.

The nickel oxide nanoparticles may include a metal dopant other than nickel.

The metal dopant may include copper, aluminum, molybdenum, vanadium, iron, lithium, manganese, silver, cobalt, zirconium, chromium, zinc, or a combination thereof.

The metal dopant may be present in an amount of less than or equal to about 20 weight percent (wt %), based on a total weight of the nickel oxide nanoparticles.

The organic ligand may be derived from a substituted or unsubstituted C1 to C10 alkylamine compound, a substituted or unsubstituted C2 to C10 carboxylic acid compound, or a combination thereof.

The organic ligand may be derived from a substituted or unsubstituted pentylamine, a substituted or unsubstituted hexylamine, a substituted or unsubstituted heptylamine, a substituted or unsubstituted octylamine, a substituted or unsubstituted nonylamine, a substituted or unsubstituted pentanoic acid, a substituted or unsubstituted hexanoic acid, a substituted or unsubstituted heptanoic acid, a substituted or unsubstituted octanoic acid, a substituted or unsubstituted nonanoic acid, or a combination thereof.

The organic ligand may be present in an amount of less than or equal to about 30 wt %, based on a total weight of the first auxiliary layer.

The light emitting device may further include a second auxiliary layer disposed between the first auxiliary layer and the quantum dot layer.

The second auxiliary layer may include poly(9,9-dioctyl-fluorene-co-N-(4-butylphenyl)-diphenylamine (TFB), polyarylamine, poly(N-vinylcarbazole), poly(3,4-ethylenedioxythiophene) (PEDOT), poly(3,4-ethylenedioxythiophene) polystyrene sulfonate (PEDOT:PSS), polyaniline, polypyrrole, N,N,N',N'-tetrakis (4-methoxyphenyl)-benzidine (TPD), 4-bis[N-(1-naphthyl)-N-phenyl-amino]biphenyl (alpha-NPD), m-MTDATA (4,4',4''-tris[phenyl(m-tolyl)amino] triphenylamine), 4,4',4''-tris(N-carbazolyl)-triphenylamine (TCTA), 1,1-bis[(di-4-tolylamino)phenylcyclohexane (TAPC), a p-type metal oxide, graphene oxide, or a combination thereof.

The light emitting device may further include a third auxiliary layer disposed between the quantum dot layer and the second electrode and the third auxiliary layer may include zinc oxide nanoparticles represented by $Zn_{1-x}M_xO$ (wherein M is Mg, Ca, Zr, W, Li, Ti, or a combination thereof and $0 \leq x < 0.5$).

The light emitting device may include an anode and a cathode, a light emitting layer including a non-cadmium-based quantum dot disposed between the anode and the cathode, and a hole auxiliary layer disposed between the anode and the light emitting layer, the hole auxiliary layer including nickel oxide nanoparticles.

According to an embodiment, a method of manufacturing a light emitting device includes providing a first electrode, forming a first auxiliary layer including nickel oxide nanoparticles having an average particle diameter of less than or equal to about 10 nm and an organic ligand on the first electrode, forming a quantum dot layer on the first auxiliary layer, and forming a second electrode on the quantum dot layer to manufacture the light emitting device.

The forming of the first auxiliary layer may be performed by a solution process.

The forming of the first auxiliary layer may include obtaining the nickel oxide nanoparticles and the organic ligand from a precursor mixture including a nickel oxide precursor and an organic ligand precursor, obtaining a composition for a first auxiliary layer including the nickel oxide nanoparticles and the organic ligand, and coating the composition for the first auxiliary layer to form the first auxiliary layer.

The organic ligand precursor may include a substituted or unsubstituted C1 to C10 alkylamine compound, a substituted or unsubstituted C2 to C10 carboxylic acid compound, or a combination thereof.

The organic ligand precursor may include a substituted or unsubstituted pentylamine, a substituted or unsubstituted hexylamine, a substituted or unsubstituted heptylamine, a substituted or unsubstituted octylamine, a substituted or unsubstituted nonylamine, a substituted or unsubstituted pentanoic acid, a substituted or unsubstituted hexanoic acid, a substituted or unsubstituted heptanoic acid, a substituted or unsubstituted octanoic acid, a substituted or unsubstituted nonanoic acid, or a combination thereof.

The obtaining the nickel oxide nanoparticles and the organic ligand may include heat treating the precursor mixture at a temperature of less than or equal to about 150° C.

The coating of the composition for the first auxiliary layer may include coating the composition for the first auxiliary layer by a spin coating, a spray coating, a slit coating, a dip coating, an inkjet printing, a nozzle printing, a doctor blade coating, or a combination thereof.

The coating of the composition for the first auxiliary layer may include heat-treating at a temperature of less than 500° C.

According to an embodiment, a display device including the light emitting device is provided.

The performance of the light emitting device may be improved.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
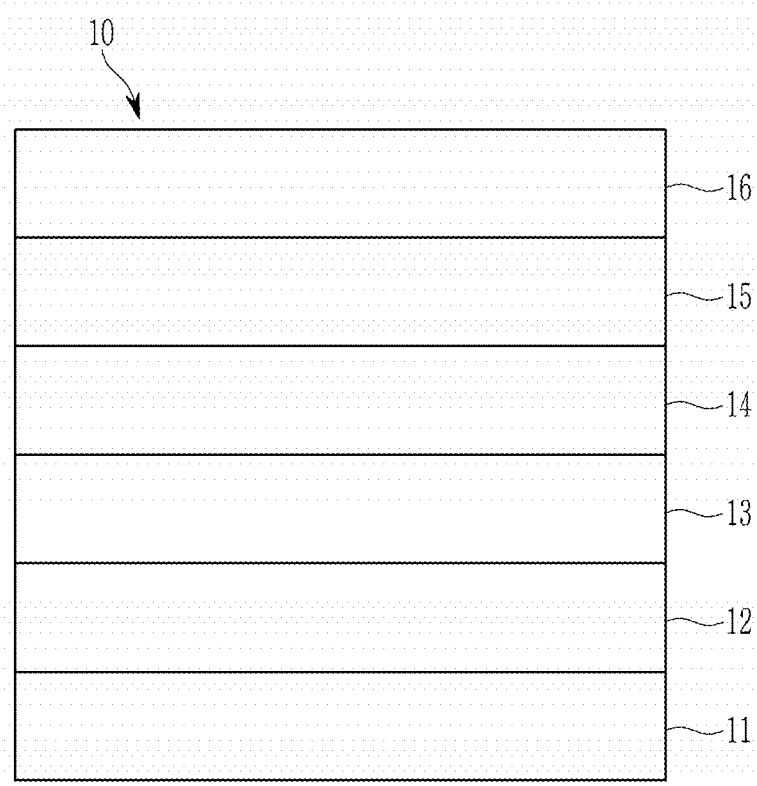
FIG. 1 is a schematic cross-sectional view of a light emitting device according to an embodiment.

Hereinafter, example embodiments of the present disclosure will be described in detail so that a person skilled in the art would understand the same. This disclosure may, however, be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer, or section from another element, component, region, layer, or section. Thus, "a first element," "component," "region," "layer" or "section" discussed below could be termed a second element, component, region, layer, or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, the term "Group" may refer to a group of Periodic Table.

As used herein, "Group I" may refer to Group IA and Group IB, and examples may include Li, Na, K, Rb, and Cs, but are not limited thereto.

As used herein, "Group II" may refer to Group IIA and Group IIB, and examples of Group metal may be Cd, Zn, Hg, and Mg, but are not limited thereto.

As used herein, "Group III" may refer to Group IIIA and Group IIIB, and examples of Group III metal may be Al, In, Ga, and TI, but are not limited thereto.

As used herein, "Group IV" may refer to Group IVA and Group IVB, and examples of a Group IV metal may be Si, Ge, and Sn, but are not limited thereto. As used herein, the term "metal" may include a semi-metal such as Si.

As used herein, "Group V" may refer to Group VA, and examples may include nitrogen, phosphorus, arsenic, antimony, and bismuth, but are not limited thereto.

As used herein, "Group VI" may refer to Group VIA, and examples may include sulfur, selenium, and tellurium, but are not limited thereto.

As used herein, a work function, a highest occupied molecular orbital (HOMO) energy level, and a lowest unoccupied molecular orbital (LUMO) energy level are expressed as an absolute value from a vacuum level. In addition, when the work function, HOMO energy level, and LUMO energy level are referred to be "deep," "high" or "large," the work function, HOMO energy level, and LUMO energy level have a large absolute value based on "electronvolts (eV)" of the vacuum level, while when the work function, HOMO energy level and LUMO energy level are referred to be "shallow," "low," or "small," the work function, HOMO energy level, and LUMO energy level have a small absolute value based on "eV" of the vacuum level.

As used herein, when a definition is not otherwise provided, "substituted" refers to replacement of a hydrogen atom of a compound by a substituent of deuterium, a halogen atom (F, Br, Cl, or I), a hydroxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid or a salt thereof, a C1 to C30 alkyl group, a C2 to C30 alkenyl group, a C2 to C30 alkynyl group, a C6 to C30 aryl group, a C7 to C30 arylalkyl group, a C1 to C30 alkoxy group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a C2 to C30 heterocyclic group, or a combination thereof.

In addition, two adjacent substituents of the substituted halogen atom (F, Br, Cl, or I), hydroxy group, nitro group, cyano group, amino group, azido group, amidino group, hydrazino group, hydrazono group, carbonyl group, carbamyl group, thiol group, ester group, carboxyl group or salt thereof, sulfonic acid group or salt thereof, phosphoric acid group or salt thereof, C1 to C30 alkyl group, C2 to C30 alkenyl group, C2 to C30 alkynyl group, C6 to C30 aryl group, C7 to C30 arylalkyl group, C1 to C30 alkoxy group, C1 to C20 heteroalkyl group, C3 to C20 heteroarylalkyl group, C3 to C30 cycloalkyl group, C3 to C15 cycloalkenyl group, C6 to C15 cycloalkynyl group, and C2 to C30 heterocyclic group may be fused to form a ring. For example, the substituted C6 to C30 aryl group may be fused with another adjacent substituted C6 to C30 aryl group to form a substituted or unsubstituted fluorene ring.

As used herein, when a definition is not otherwise provided, "hetero" refers to one including 1 to 3 heteroatoms of N, O, S, Se, or P.

As used herein, the particle diameter may be obtained by analyzing a two-dimensional image obtained from an electron microscope analysis (e.g., TEM or SEM) with a commercially available image analysis program (e.g., image J).

As used herein, an average may be a mean, a mode, or a median.

As used herein, the average particle diameter may be a sum of a particle diameter of a plurality of particles divided by the number of particles. Hereinafter, a light emitting device according to an embodiment is described with reference to drawings.

FIG. 1 is a schematic cross-sectional view of a light emitting device according to an embodiment.

Referring to FIG. 1, a light emitting device 10 according to an embodiment includes a first electrode 11 and a second electrode 16, a quantum dot layer 14 disposed between the first electrode 11 and the second electrode 16, a first auxiliary layer 12 disposed between the quantum dot layer 14 and the first electrode 11, a second auxiliary layer 13 disposed between the first auxiliary layer 12 and the quantum dot layer 14, and a third auxiliary layer 15 disposed between the quantum dot layer 14 and the second electrode 16.

A substrate (not shown) may be disposed at the first electrode 11 side or the second electrode 16 side. The substrate may be, for example, made of an inorganic material such as glass; an organic material such as polycarbonate, polymethylmethacrylate, polyethylene terephthalate, polyethylene naphthalate, polyamide, polyethersulfone, or a combination thereof; or a silicon wafer. The substrate may be omitted.

One of the first electrode 11 and the second electrode 16 may be an anode and the other may be a cathode. For example, the first electrode 11 may be an anode and the second electrode 16 may be a cathode. For example, the first electrode 11 may be a cathode and the second electrode 16 may be an anode. For example, the first electrode 11 and the second electrode 16 may face each other.

The first electrode 11 may be for example made of a conductor, for example a metal, a conductive metal oxide, or a combination thereof. The first electrode 11 may include for example a metal or an alloy thereof such as nickel, platinum, vanadium, chromium, copper, zinc, and gold; a conductive metal oxide such as zinc oxide, indium oxide, tin oxide, indium tin oxide (ITO), indium zinc oxide (IZO), or fluorine doped tin oxide; or a combination of a metal and an oxide such as ZnO and Al or $SnO_2$ and Sb, but is not limited thereto. For example, the first electrode 11 may include a transparent conductive metal oxide, for example, indium tin oxide. The first electrode 11 may have a higher work function than the work function of the second electrode 16 that will be described later. The first electrode 11 may have a lower work function than the work function of the second electrode 16 that will be described later.

The second electrode 16 may be for example made of a conductor, for example a metal, a conductive metal oxide, a conductive polymer, or a combination thereof. The second electrode 16 may include for example a metal or an alloy thereof such as aluminum, magnesium, calcium, sodium, potassium, titanium, indium, yttrium, lithium, gadolinium silver, gold, platinum, tin, lead, cesium, barium, and the like, a multi-layer structure material such as LiF/Al, $Li_2O$/Al, Liq/Al, LiF/Ca, and $BaF_2$/Ca, but is not limited thereto. The conductive metal oxide is the same as described herein.

For example, a work function of the first electrode 11 may be for example about 4.5 eV to about 5.0 eV and a work function of the second electrode 16 may be for example greater than or equal to about 4.0 eV and less than about 4.5 eV. Within the disclosed ranges, the work function of the first electrode 11 may be for example about 4.6 eV to about 4.9 eV and the work function of the second electrode 16 may be for example about 4.0 eV to about 4.3 eV.

The first electrode 11, the second electrode 16, or a combination thereof may be a light-transmitting electrode and the light-transmitting electrode may be for example made of a conductive oxide such as a zinc oxide, indium oxide, tin oxide, indium tin oxide (ITO), indium zinc oxide (IZO), or fluorine doped tin oxide, or a metal thin layer of a single layer or a multilayer. When one of the first electrode 11 and the second electrode 16 is a non-light-transmitting electrode, the non-light-transmitting first electrode 11 or second electrode 16 may be made of for example an opaque conductor such as aluminum (Al), silver (Ag), or gold (Au).

A thickness of the first electrode 11, a thickness of the second electrode 16, or a thickness of each of the first electrode 11 and the second electrode 16 are not particularly limited and may be appropriately selected taking into consideration device efficiency. For example, the thickness of the first electrode 11, the thickness of the second electrode 16, or the thickness of each of the first electrode 11 and the second electrode 16 may be greater than or equal to about 5 nm, for example, greater than or equal to about 50 nm. For example, the thickness of the first electrode 11, the thickness of the second electrode 16, or the thickness of each of the first electrode 11 and the second electrode 16 may be less than or equal to about 100 micrometers (μm), for example, 10 μm, less than or equal to about 1 μm, less than or equal to about 900 nm, less than or equal to about 500 nm, or less than or equal to about 100 nm.

The quantum dot layer 14 includes a quantum dot. The quantum dot may be a semiconductor nanocrystal, and may have various shapes, for example an isotropic semiconductor nanocrystal, a quantum rod, and a quantum plate. Herein, the quantum rod may indicate a quantum dot having an aspect ratio of greater than about 1:1, for example an aspect ratio of greater than or equal to about 2:1, greater than or equal to about 3:1, or greater than or equal to about 5:1. For example, the quantum rod may have an aspect ratio of less than or equal to about 50:1, of less than or equal to about 30:1, or of less than or equal to about 20:1.

The quantum dot may have for example a particle diameter (a length of the largest portion for a non-spherical shape) of for example about 1 nm to about 100 nm, about 1 nm to about 80 nm, about 1 nm to about 50 nm, or about 1 nm to about 20 nm.

A bandgap energy of a quantum dot may be controlled according to sizes and a composition of the quantum dot, and photoluminescence wavelength may be controlled. For example, as the size of a quantum dots increases, the quantum dot may have a narrow energy bandgap energy and emit light in a relatively long wavelength region while as the size of a quantum dots decreases, the quantum dot may have a wide bandgap energy and emit light in a relatively short wavelength region.

For example, the quantum dot may emit for example light in a predetermined wavelength region of a visible region according to the size, composition, or a combination thereof of the quantum dot. For example, the quantum dot may emit blue light, red light, or green light, and the blue light may have for example a peak emission wavelength in about 430 nm to about 470 nm, the red light may have for example a peak emission wavelength in about 600 nm to about 650 nm, and the green light may have for example a peak emission wavelength in about 520 nm to about 550 nm. For example, the quantum dot may emit blue light having a peak emission wavelength in a wavelength of about 430 nm to about 470 nm.

The quantum dot may have for example a quantum yield of greater than or equal to about 10%, greater than or equal to about 30%, greater than or equal to about 50%, greater than or equal to about 60%, greater than or equal to about 70%, or greater than or equal to about 90%.

The quantum dot may have a relatively narrow full width at half maximum (FWHM). Herein, the FWHM a width of a wavelength corresponding to a half of a peak absorption point and as the FWHM is narrower, light in a narrower wavelength region may be emitted and high color purity may be obtained. The quantum dot may have for example a FWHM of less than or equal to about 50 nm, less than or equal to about 49 nm, less than or equal to about 48 nm, less than or equal to about 47 nm, less than or equal to about 46 nm, less than or equal to about 45 nm, less than or equal to about 44 nm, less than or equal to about 43 nm, less than or equal to about 42 nm, less than or equal to about 41 nm, less than or equal to about 40 nm, less than or equal to about 39 nm, less than or equal to about 38 nm, less than or equal to about 37 nm, less than or equal to about 36 nm, less than or equal to about 35 nm, less than or equal to about 34 nm, less than or equal to about 33 nm, less than or equal to about 32 nm, less than or equal to about 31 nm, less than or equal to about 30 nm, less than or equal to about 29 nm, or less than or equal to about 28 nm.

For example, the quantum dot may be for example a Group I-VI semiconductor compound, a Group III-V semiconductor compound, a Group IV-VI semiconductor compound, a Group IV semiconductor compound, a Group I-III-VI semiconductor compound, a Group I-II-IV-VI semiconductor compound, a Group II-III-V semiconductor compound, or a combination thereof. The Group II-VI semiconductor compound may be for example a binary element compound such as CdSe, CdTe, ZnS, ZnSe, ZnTe, ZnO, HgS, HgSe, HgTe, MgSe, MgS, or a combination thereof; a ternary element compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or a combination thereof; a quaternary element compound such as HgZnTeS, CdZnSeS, CdZnSeTe, CdZnSTe, CdHgSeS, CdHgSeTe, CdHgSTe, HgZnSeS, HgZnSeTe, HgZnSTe, or a combination thereof; or a combination thereof, but is not limited thereto. The Group III-V semiconductor compound may be for example a binary element compound such as GaN, GaP, GaAs, GaSb, AlN, AlP, AlAs, AlSb, InN, InP, InAs, InSb, or a combination thereof; a ternary element compound such as GaNP, GaNAs, GaNSb, GaPAs, GaPSb, AlNP, AlNAs, AlNSb, AlPAs, AlPSb, InNP, InNAs, InNSb, InPAs, InPSb, GaAlNP, or a combination thereof; a quaternary element compound such as GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof; or a combination thereof, but is not limited thereto. The Group IV-VI semiconductor compound may be for example a binary element compound such as SnS, SnSe, SnTe, PbS, PbSe, PbTe, or a combination thereof; a ternary element compound such as SnSeS, SnSeTe, SnSTe, PbSeS, PbSeTe, PbSTe, SnPbS, SnPbSe, SnPbTe, or a combination thereof; a quaternary element compound such as SnPbSSe, SnPbSeTe, SnPbSTe, or a combination thereof; or a combination thereof, but is not limited thereto. The Group IV semiconductor compound may be for example a singular element semiconductor compound such as Si, Ge, or a combination thereof; a binary element semiconductor compound of SiC, SiGe, or a combination thereof; or a combination thereof, but is not limited thereto. The Group I-III-VI semiconductor compound may be for example $CuInSe_2$, $CuInS_2$, CuInGaSe, CuInGaS, or a combination thereof, but is not limited thereto. The Group I-II-IV-VI semiconductor compound may be for example CuZnSnSe, CuZnSnS, or a combination thereof, but is not limited thereto. The Group II-III-V semiconductor compound may include for example InZnP, but is not limited thereto.

The quantum dot may include the binary semiconductor compound, the ternary semiconductor compound, or the quaternary semiconductor compound in a substantially uniform concentration or partially different concentration distributions.

For example, the quantum dot may include a non-cadmium-based quantum dot. Cadmium (Cd) may cause environment/health problems and is a restricted element by Restriction of Hazardous Substances Directive (RoHS) in a plurality of countries, and it may be desirable to use a non-cadmium-based quantum dot. For example, in an embodiment, the quantum dot may not include cadmium, for example, the quantum dot may not include cadmium, mercury, or lead.

For example, the quantum dot may include for example a Group III-V semiconductor compound including indium and phosphorus, and may further include for example zinc. For example, the quantum dot may include a Group II-VI compound including a chalcogen element and zinc, and for example the chalcogen element may be sulfur, selenium, tellurium, or a combination thereof.

For example, the quantum dot may be a semiconductor compound including zinc (Zn) and tellurium (Te), selenium (Se), or a combination thereof. For example, the quantum dot may be a Zn—Te semiconductor compound, a Zn—Se semiconductor compound, a Zn—Te—Se semiconductor compound, or a combination thereof. For example, in the Zn—Te—Se semiconductor compound, an amount of tellurium (Te) may be less than that of selenium (Se). The semiconductor compound may have a peak emission wavelength in a wavelength region of less than or equal to about 470 nm, for example in a wavelength region of about 430 nm to about 470 nm and may emit blue light.

The quantum dot may have one quantum dot core and a multi-layered quantum dot shell surrounding the core. Herein, the multi-layered shell has at least two shells wherein each shell may be a single composition, may be an alloy, may have a concentration gradient, or a combination thereof.

For example, a shell of a multi-layered shell that is farther from the core may have a higher bandgap energy than a shell that is closer, e.g., near, to the core, and the quantum dot may exhibit a quantum confinement effect.

For example, the quantum dot having a core-shell structure may for example include a core including InP, InZnP, ZnSe, ZnSeTe, or a combination thereof and a shell disposed on a, e.g., at least one, portion of the core and having a different composition from that of the core. Herein, the shell may include InP, InZnP, ZnSe, ZnS, ZnSeTe, ZnSeS, or a combination thereof.

The quantum dot layer 14 may have for example a thickness of about 5 nm to about 200 nm, for example about 10 nm to about 150 nm, about 10 nm to about 100 nm, or about 10 nm to about 50 nm.

The quantum dot layer 14 may have a relatively high HOMO energy level and may be for example a HOMO energy level of greater than or equal to about 5.4 eV, greater than or equal to about 5.6 eV, greater than or equal to about 5.7 eV, or greater than or equal to about 5.8 eV. The HOMO energy level of the quantum dot layer 14 may be for example about 5.4 eV to about 7.0 eV, about 5.4 eV to about 6.8 eV, about 5.4 eV to about 6.7 eV, about 5.4 eV to about 6.5 eV, about 5.4 eV to about 6.3 eV, about 5.4 eV to about 6.2 eV, or about 5.4 eV to about 6.1 eV, within the disclosed ranges, for example about 5.6 eV to about 7.0 eV, about 5.6 eV to about 6.8 eV, about 5.6 eV to about 6.7 eV, about 5.6 eV to about 6.5 eV, about 5.6 eV to about 6.3 eV, about 5.6 eV to about 6.2 eV, or about 5.6 eV to about 6.1 eV, for example about 5.7 eV to about 7.0 eV, about 5.7 eV to about 6.8 eV, about 5.7 eV to about 6.7 eV, about 5.7 eV to about 6.5 eV, about 5.7 eV to about 6.3 eV, about 5.7 eV to about 6.2 eV, or about 5.7 eV to about 6.1 eV.

The quantum dot layer 14 may have a relatively low LUMO energy level, and may have for example an LUMO energy level of less than or equal to about 3.6 eV, for example less than or equal to about 3.5 eV, less than or equal to about 3.4 eV, less than or equal to about 3.3 eV, less than or equal to about 3.2 eV, or less than or equal to about 3.0 eV. The LUMO energy level of the quantum dot layer 14 may be for example about 2.5 eV to about 3.6 eV, about 2.5 eV to about 3.5 eV, about 2.5 eV to about 3.4 eV, about 2.5 eV to about 3.3 eV, about 2.5 eV to about 3.2 eV, about 2.5 eV to about 3.1 eV, or about 2.5 eV to about 3.0 eV.

The first auxiliary layer 12 may be disposed between the first electrode 11 and the quantum dot layer 14 and may increase injection of charges moving from the first electrode 11 to the quantum dot layer 14, transfer characteristics of charges moving from the first electrode 11 to the quantum dot layer 14, or a combination thereof or may block opposite charges from flowing over from the quantum dot layer 14. The first auxiliary layer 12 may be one layer or two or more layers. For example, the first auxiliary layer 12 may include a hole auxiliary layer to increase injection of the holes moving from the first electrode 11 to the quantum dot layer 14, movement characteristics of the holes moving from the first electrode 11 to the quantum dot layer 14, or a combination thereof; an electron blocking layer to block the charges from flowing over from the quantum dot layer 14; or a combination thereof. For example, the first auxiliary layer 12 may be a hole injection layer to facilitate the injection of holes from the first electrode 11 or a hole transport layer to increase the transport of holes from the first electrode 11 to the quantum dot layer 14.

The first auxiliary layer 12 may include an inorganic material, for example an inorganic material as a main component. Herein the main component may be included in an amount of greater than about 50 volume percent (volume %), greater than or equal to about 55 volume %, greater than or equal to about 60 volume %, greater than or equal to about 70 volume %, greater than or equal to about 80 volume %, greater than or equal to about 90 volume %, or greater than or equal to about 95 volume %, based on a total volume of the first auxiliary layer 12. Accordingly, stability against moisture, oxygen, etc. of the light emitting device may be improved, e.g., secured, interface resistance between the first electrode 11 and the first auxiliary layer 12 may be reduced by decreasing or preventing corrosion of the first electrode 11 under the first auxiliary layer 12, and life-span of the emitting device may be improved.

The first auxiliary layer 12 may include for example inorganic nanoparticles consisting of an inorganic material or including an inorganic material as a main component. The inorganic nanoparticles may be two-dimensional or three-dimensional particles having a particle diameter of nanoscale, and may have for example a particle diameter less than or equal to about 20 nm, less than or equal to about 15 nm, less than or equal to about 10 nm, less than or equal to about 9 nm, less than or equal to about 8 nm, less than or equal to about 7 nm, less than or equal to about 6 nm, or less than about 5 nm.

The average particle diameter of a plurality of inorganic nanoparticles included in the first auxiliary layer 12 may be less than or equal to about 10 nm for example, less than or equal to about 9 nm, less than or equal to about 8 nm, less than or equal to about 7 nm, less than or equal to about 6 nm, less than about 5 nm, less than or equal to about 4 nm, less than or equal to about 3.5 nm, less than or equal to about 3.3 nm or less than or equal to about 3.2 nm, for example greater than or equal to about 1 nm, for example, greater than or equal to about 2 nm, greater than or equal to about 2.3 nm, or greater than or equal to about 2.5 nm.

Sizes of a plurality of inorganic nanoparticles included in the first auxiliary layer 12 may be distributed relatively evenly. For example, about 90% or greater of the total number of the inorganic nanoparticles included in the first auxiliary layer 12 may fall within about ±30%, about ±28%, about ±26%, about ±25%, about ±24%, about ±23%, or about ±22% of the average particle diameter of the inorganic nanoparticles. Accordingly, the thickness of the first auxiliary layer 12 may be uniform.

For example, a standard deviation of a particle diameter of a plurality of inorganic nanoparticles may be less than or equal to about 2 nm, less than or equal to about 1.7 nm, less than or equal to about 1.4 nm, less than or equal to about 1.2 nm, less than or equal to about 1 nm, less than or equal to about 0.8 nm, or less than or equal to about 0.5 nm.

For example, the inorganic nanoparticles may include metal oxide nanoparticles and may include for example p-type metal oxide nanoparticles. The p-type metal oxide nanoparticles may have a relatively high HOMO energy level to match an energy level of the quantum dot layer 14. For example, the p-type metal oxide nanoparticles may have a HOMO energy level that is the same as that of the quantum dot layer 14 or less than a HOMO energy level of the quantum dot layer 14 within a range of about 1.0 eV or less. For example, a difference between HOMO energy levels of the p-type metal oxide nanoparticles and the quantum dot layer 14 may be about 0 eV to about 1.0 eV, for example about 0.01 eV to about 0.8 eV, about 0.01 eV to about 0.7 eV, about 0.01 eV to about 0.5 eV, about 0.01 eV to about 0.4 eV, about 0.01 eV to about 0.3 eV, or about 0.01 eV to about 0.2 eV.

For example, the p-type metal oxide nanoparticles may have a HOMO energy level of for example greater than or equal to about 5.0 eV, greater than or equal to about 5.2 eV, greater than or equal to about 5.4 eV, or greater than or equal to about 5.5 eV. For example, the p-type metal oxide nanoparticles may have a HOMO energy level of about 5.0 eV to about 7.0 eV, for example about 5.2 eV to about 6.8 eV, about 5.4 eV to about 6.8 eV, about 5.4 eV to about 6.7 eV, about 5.4 eV to about 6.5 eV, about 5.4 eV to about 6.3 eV, about 5.4 eV to about 6.2 eV, or about 5.4 eV to about 6.1 eV. Accordingly, the injection of holes from the first electrode, transport of holes from the first electrode, or a combination thereof may be facilitated to impart an excellent electrical characteristic to the light emitting device.

For example, the inorganic nanoparticles may include nickel-containing oxide nanoparticles (hereinafter, referred to as "nickel oxide nanoparticles"). The nickel oxide nanoparticles can have high crystallinity, for example crystallinity of greater than or equal to about 50%, greater than or equal to about 60%, greater than or equal to about 70%, greater than or equal to about 80%, greater than or equal to about 90%, greater than or equal to about 95%, or greater than or equal to about 98%. The nickel oxide nanoparticles may have for example a cubic crystal structure (cubic system). For example, the nickel oxide nanoparticles may include a simple lattice structure, a body center lattice structure, a face center lattice structure, or a combination thereof. As the nickel oxide nanoparticles have crystallinity, charge conductivity of the first auxiliary layer may be improved, and excellent electrical characteristics may be provided to the light emitting device.

For example, the first auxiliary layer 12 may include a plurality of nickel oxide nanoparticles. An average particle diameter of the plurality of nickel oxide nanoparticles may be for example less than or equal to about 10 nm, for example, less than or equal to about 9 nm, less than or equal to about 8 nm, less than or equal to about 7 nm, less than or equal to about 6 nm, less than about 5 nm, less than or equal to about 4 nm, less than or equal to about 3.5 nm, less than or equal to about 3.3 nm, or less than or equal to about 3.2 nm. The nickel oxide nanoparticles may have an average particle diameter within the disclosed range, and uniformity of a film thickness of the first auxiliary layer 12 may be increased.

The average particle diameter of the plurality of nickel oxide nanoparticles may be for example greater than or equal to about 1 nm, greater than or equal to about 2 nm, or greater than or equal to about 2.5 nm. The nickel oxide nanoparticles may have an average particle diameter within the disclosed ranges, and the first auxiliary layer may include nickel in a sufficient amount to transport holes injected from the first electrode.

For example, the average particle diameter of the plurality of nickel oxide nanoparticles may be greater than or equal to about 1 nm and less than about 5 nm, greater than or equal to about 1 nm and less than or equal to about 4 nm, greater than or equal to about 1 nm and less than or equal to about 3.5 nm, greater than or equal to about 1 nm and less than or equal to about 3.3 nm, greater than or equal to about 1 nm and less than or equal to about 3.2 nm, greater than or equal to about 2 nm and less than about 5 nm, greater than or equal to about 2 nm and less than or equal to about 4 nm, greater than or equal to about 2 nm and less than or equal to about 3.5 nm, greater than or equal to about 2 nm and less than or equal to about 3.3 nm, greater than or equal to about 2 nm and less than or equal to about 3.2 nm, greater than or equal to about 2.5 nm and less than about 5 nm, greater than or equal to about 2.5 nm and less than or equal to about 4 nm, greater than or equal to about 2.5 nm and less than or equal to about 3.5 nm, greater than or equal to about 2.5 nm and less than or equal to about 3.3 nm, or greater than or equal to about 2.5 nm and less than or equal to about 3.2 nm.

For example, sizes of a plurality of nickel oxide nanoparticles may be distributed relatively evenly. For example, about 90% or greater of the total number of the nickel oxide nanoparticles included in the first auxiliary layer 12 may fall within about ±30% range, about ±28% range, about ±26% range, about ±25% range, about ±24% range, about ±23% range, or about ±22% range of the average particle diameter of the nickel oxide nanoparticles. Accordingly, the thickness of the first auxiliary layer 12 may be uniform.

For example, a standard deviation of a particle diameter of a plurality of nickel oxide nanoparticles may be less than or equal to about 2 nm, less than or equal to about 1.7 nm, less than or equal to about 1.4 nm, less than or equal to about 1.2 nm, less than or equal to about 1 nm, less than or equal to about 0.8 nm, or less than or equal to about 0.5 nm. The nickel oxide nanoparticles may be nanoparticles consisting of nickel oxide or including nickel oxide as a main component.

For example, the nickel oxide nanoparticles may be made of nickel oxide, such as for example NiO.

For example, the nickel oxide nanoparticles may include nickel oxide as a main component, and may further include a dopant other than nickel. The dopant may be a metal dopant or a semi-metal dopant and may be for example a metal dopant. The metal dopant may include for example copper, aluminum, molybdenum, vanadium, iron, lithium, manganese silver, cobalt, zirconium, chromium, zinc, or a combination thereof, but is not limited thereto.

The dopant may finely deform a crystal structure of nickel oxide, such that the crystallinity and a HOMO energy level, LUMO energy level, or a combination thereof of nickel oxide can effectively be controlled. Accordingly, the first auxiliary layer 12 may be adjusted to have desired electrical characteristics between the first electrode 11 and the quantum dot layer 14. Accordingly, the performance and stability of the light emitting device may be increased.

For example, the metal dopant may be included in an amount of less than about 50 wt %, less than or equal to about 40 wt %, less than or equal to about 30 wt %, less than or equal to about 20 wt %, less than or equal to about 15 wt %, less than or equal to about 10 wt %, for example about 0.1 wt % to about 50 wt %, about 0.1 wt % to about 40 wt %, about 0.1 wt % to about 30 wt %, about 0.1 wt % to about 20 wt %, about 0.1 wt % to about 15 wt %, or about 0.1 wt % to about 10 wt %, based on a total weight of the nickel oxide nanoparticles.

The nickel oxide nanoparticles may include the organic ligand that is bound or attached to a surface thereof. The organic ligand may be bound or attached to a surface of nickel oxide nanoparticles to decrease or prevent agglomeration of the nickel oxide nanoparticles in a solvent or dispersive medium, enabling the formation of first auxiliary layer 12 through a solution process.

The organic ligand may be derived from a compound with a functional group that may be attached or bound to a surface of the nickel oxide. For example, the organic ligand may be derived from a compound having a substituted or unsubstituted amine group, a substituted or unsubstituted carboxyl group, or a combination thereof, for example a compound having a aliphatic or aromatic hydrocarbon having a substituted or unsubstituted amine group, an aliphatic or aromatic hydrocarbon having a substituted or unsubstituted carboxyl group, or a combination thereof.

For example, the aliphatic or aromatic hydrocarbon having a substituted or unsubstituted amine group and the aliphatic or aromatic hydrocarbon having the substituted or unsubstituted carboxyl group may be an aliphatic or aromatic hydrocarbon having a relatively low carbon number, for example an aliphatic or aromatic hydrocarbon having a carbon number of 10 or less, 9 or less, or 8 or less. For example, the organic ligand may be derived from a substituted or unsubstituted C1 to C10 alkylamine compound, a substituted or unsubstituted C2 to C10 carboxylic acid compound, or a combination thereof.

As such, by including the organic ligand, dispersion of the nickel oxide nanoparticles may be improved due to the organic ligand in the coating process and also by including the organic ligand derived from the compound having the relatively low carbon number, the content of an organic material remaining in the first auxiliary layer 12 may be reduced, and deterioration of electrical characteristics caused by the organic ligand may be reduced or prevented.

For example, the substituted or unsubstituted C1 to C10 alkylamine compound may be, for example, a substituted or unsubstituted C3 to C8 alkylamine compound, a substituted or unsubstituted C5 to C8 alkylamine compound, or a substituted or unsubstituted C6 to C8 alkylamine compound. For example, the substituted or unsubstituted C2 to C10 carboxylic acid compound may be for example, a substituted or unsubstituted C3 to C8 carboxylic acid compound, a substituted or unsubstituted C5 to C8 carboxylic acid compound, or a substituted or unsubstituted C6 to C8 carboxylic acid compound.

For example, the substituted or unsubstituted C1 to C10 alkylamine compound may be a substituted or unsubstituted pentylamine, a substituted or unsubstituted hexylamine, a substituted or unsubstituted heptylamine, a substituted or unsubstituted octylamine, a substituted or unsubstituted nonylamine, or a combination thereof.

For example, the substituted or unsubstituted C2 to C10 carboxylic acid compound may be a substituted or unsubstituted pentanoic acid, a substituted or unsubstituted hexanoic acid, a substituted or unsubstituted heptanoic acid, a substituted or unsubstituted octanoic acid, a substituted or unsubstituted nonanoic acid, or a combination thereof.

For example, the organic ligand may be derived from a substituted or unsubstituted octylamine, a substituted or unsubstituted octanoic acid, or a combination thereof. For example, in the first auxiliary layer 12, an amount of an organic ligand derived from a substituted or unsubstituted octyl amine may be greater than an amount of an organic ligand derived from a substituted or unsubstituted octanoic acid.

The first auxiliary layer 12 may include a portion or all of the aforementioned organic ligands. The organic ligand may be attached or bound to the surface of the nickel oxide nanoparticles in the first auxiliary layer 12, or may be separated from the nickel oxide nanoparticles. For example, the organic ligand may exist between the adjacent nickel oxide nanoparticles.

For example, the organic ligand may be, for example, in an amount of less than or equal to about 30 volume %, less than or equal to about 25 volume %, or less than or equal to about 20 volume %, for example, about 1 volume % to about 30 volume %, about 1 volume % to about 25 volume %, about 1 volume % to about 20 volume %, about 5 volume % to about 30 volume %, about 5 volume % to about 25 volume %, or about 5 volume % to about 20 volume %, based on a total volume the first auxiliary layer 12.

For example, the organic ligand may be in an amount of less than or equal to about 30 wt %, for example, less than or equal to about 25 wt %, or less than or equal to about 20 wt %, for example, about 1 wt % to about 30 wt %, about 1 wt % to about 25 wt %, about 1 wt % to about 20 wt %, about 5 wt % to about 30 wt %, about 5 wt % to about 25 wt %, or about 5 wt % to about 20 wt %, based on a total weight of the first auxiliary layer 12.

The first auxiliary layer 12 may include the organic ligand within the disclosed range, the first auxiliary layer 12 may have sufficient insulating characteristics to decrease or prevent opposite charges from flowing over from the quantum dot layer 14, and current leakage of the light emitting device including the first auxiliary layer 12 may be reduced.

For example, the first auxiliary layer 12 may have a thickness, for example, greater than or equal to about 1 nm, greater than or equal to about 3 nm, or greater than or equal to about 5 nm, for example, less than or equal to about 50 nm, less than or equal to about 40 nm, less than or equal to about 30 nm, less than or equal to about 25 nm, or less than or equal to about 20 nm, for example, about 1 nm to about 50 nm, or about 5 nm to about 20 nm. Accordingly, the first auxiliary layer 12 may easily transport holes injected from the first electrode 11. If the thickness of the first auxiliary layer 12 is greater than the disclosed range, it may be difficult for the first auxiliary layer 12 to transport the holes injected from the first electrode 11 efficiently. In addition, when the thickness of the first auxiliary layer 12 is less than the disclosed range, it may be difficult for the first auxiliary layer 12 to have a uniform thickness, and the light emitting device including the first auxiliary layer 12 having a thickness less than the disclosed range may cause a short circuit.

The second auxiliary layer 13 may be disposed between the first auxiliary layer 12 and the quantum dot layer 14, and may be one layer or two or more layers. The second auxiliary layer 13 may be omitted. The second auxiliary layer 13 may include a hole auxiliary layer for example, for example, a hole transport layer, an electron blocking layer, or a combination thereof. For example, the second auxiliary layer 13 disposed between the first auxiliary layer 12 and the quantum dot layer 14 may decrease or prevent exciton quenching from occurring at the interface of first auxiliary layer 12 and quantum dot layer 14, and efficiency deterioration of light emitting devices may be prevented.

The second auxiliary layer 13 may be different from the first auxiliary layer 12. For example, the first auxiliary layer 12 may have a HOMO energy level of about 5.0 eV to about 6.0 eV, within the disclosed range, for example about 5.0 eV to about 5.5 eV. For example, the second auxiliary layer 13 may have a HOMO energy level of about 5.2 eV to about 7.0 eV, within the disclosed range, for example about 5.3 eV to about 6.8 eV, about 5.3 eV to about 6.5 eV, about 5.3 eV to about 6.3 eV, or about 5.3 eV to about 6.1 eV. When the energy levels of the first auxiliary layer 12 and the second auxiliary layer 13 are as described herein, holes may be transported to the quantum dot layer 14 more efficiently, and efficiency of the light emitting device may be further improved.

For example, the second auxiliary layer 13 may include an organic material, an inorganic material, an organic/inorganic material, or a combination thereof, for example poly(9,9-dioctyl-fluorene-co-N-(4-butylphenyl)-diphenylamine (TFB), polyarylamine, poly(N-vinylcarbazole, polyaniline, polypyrrole, N,N,N',N'-tetrakis(4-methoxyphenyl)-benzidine (TPD), (4-bis[N-(1-naphthyl)-N-phenyl-amino]biphenyl (α-NPD), m-MTDATA (4,4',4''-tris[phenyl(m-tolyl)amino]triphenylamine), 4,4',4''-tris(N-carbazolyl)-triphenylamine (TCTA), 1-bis[(di-4-tolylamino)phenylcyclohexane (TAPC), p-type metal oxide (e.g., NiO, $WO_3$, $MoO_3$, etc.), a carbon-based material such as graphene oxide, or a combination thereof, but is not limited thereto.

For example, the second auxiliary layer 13 may include an organic material, for example, poly(9,9-dioctyl-fluorene-co-N-(4-butylphenyl)-diphenylamine (TFB), but is not limited thereto.

For example, the second auxiliary layer 13 may have a thickness, for example, greater than or equal to about 1 nm, greater than or equal to about 3 nm, or greater than or equal to about 5 nm, for example, less than or equal to about 50 nm, less than or equal to about 40 nm, less than or equal to about 30 nm, less than or equal to about 25 nm, or less than or equal to about 20 nm, for example, about 1 nm to about 50 nm, or about 5 nm to about 20 nm. Accordingly, the second auxiliary layer 13 may easily transfer holes injected or transported from the first auxiliary layer 12. If the thickness of the second auxiliary layer 13 is greater than the disclosed range, it may be difficult for the second auxiliary layer 13 to transport holes injected from the first auxiliary layer 12 efficiently. In addition, when the thickness of the second auxiliary layer 13 is less than the disclosed range, it may be difficult for the second auxiliary layer 13 to have a uniform thickness, and a light emitting device including the first auxiliary layer 12 having a thickness less than the disclosed range may cause a short circuit.

Optionally, an additional layer (not shown) may be further included between the first electrode 11 and the quantum dot layer 14. For example, the additional layer may be further included between the first electrode 11 and the first auxiliary layer 12, the additional layer may be further included between the first auxiliary layer 12 and second auxiliary layer 13, an additional layer may be further included between the second auxiliary layer 13 and the quantum dot layer 14, or a combination thereof.

The third auxiliary layer 15 may be disposed between the quantum dot layer 14 and the second electrode 16 and may be one layer or two or more layers. The third auxiliary layer 15 may be omitted. The third auxiliary layer 15 may include an example, an electron auxiliary layer, for example, an electron injection layer, an electron transport layer, a hole blocking layer, or a combination thereof.

For example, the third auxiliary layer 15 may have a HOMO energy level that is higher or lower than the HOMO energy of the quantum dot layer 14. For example, the third auxiliary layer 15 may have a HOMO energy level of greater than or equal to about 4.5 eV, greater than or equal to about 5 eV, greater than or equal to about 5.5 eV, greater than or equal to about 6 eV, greater than or equal to about 6.5 eV, greater than or equal to about 6.6 eV, greater than or equal to about 6.7 eV, greater than or equal to about 6.8 eV, greater than or equal to about 6.9 eV, greater than or equal to about 7 eV, greater than or equal to about 7.1 eV, greater than or equal to about 7.2 eV, greater than or equal to about 7.3 eV, greater than or equal to about 7.4 eV, greater than or equal to about 7.5 eV, greater than or equal to about 7.6 eV, greater than or equal to about 7.7 eV, greater than or equal to about 7.8 eV, greater than or equal to about 7.9 eV, or greater than or equal to about 8.0 eV, for example, less than or equal to about 9.5 eV, or less than or equal to about 9.0 eV, or less than or equal to about 8.5 eV.

For example, the third auxiliary layer 15 may have a LUMO energy level that is higher than the LUMO energy level of the quantum dot layer 14. For example, the third auxiliary layer 15 may have a LUMO energy level of greater than or equal to about 2.5 eV, greater than or equal to about 3.0 eV, greater than or equal to about 3.5 eV, or greater than or equal to about 4.0 eV, for example less than or equal to about 7.0 eV, less than or equal to about 6.5 eV, less than or equal to about 6.0 eV, less than or equal to about 5.5 eV, less than or equal to about 5.0 eV, or less than or equal to about 4.5 eV.

The electron transport layer, the electron injection layer, or a combination thereof may include, for example an organic material, an inorganic material, an organic/inorganic material, or a combination thereof, for example 1,4,5,8-naphthalene-tetracarboxylic dianhydride (NTCDA), bathocuproine (BCP), tris[3-(3-pyridyl)-mesityl]borane (3TP-YMB), LiF, Alq$_3$, Gaq$_3$, Inq$_3$, Znq$_2$, Zn(BTZ)$_2$, BeBq$_2$, ET204 (8-(4-(4,6-di(naphthalen-2-yl)-1,3,5-triazin-2-yl) phenyl)quinolone), 8-hydroxyquinolinato lithium (Liq), an n-type metal oxide (e.g., ZnO, HfO$_2$, etc.), or a combination thereof, but is not limited thereto.

The hole blocking layer may include, for example an organic material, an inorganic material, an organic/inorganic material, or a combination thereof, for example 1,4,5,8-naphthalene-tetracarboxylic dianhydride (NTCDA), bathocuproine (BCP), tris[3-(3-pyridyl)-mesityl]borane (3TP-YMB), LiF, Alq$_3$, Gaq$_3$, Inq$_3$, Znq$_2$, Zn(BTZ)$_2$, BeBq$_2$, or a combination thereof, but is not limited thereto.

For example, the third auxiliary layer 15 may include an electron transport layer and may increase transport of electrons from the second electrode 16 to the quantum dot layer 14.

For example, the third auxiliary layer 15 may include an n-type metal oxide, for example, an n-type metal oxide nanoparticle.

For example, the third auxiliary layer 15 may include a zinc oxide nanoparticle. The zinc oxide may be an oxide including zinc as a main component and optionally, doped with another metal or semi-metal and may be, for example, represented by $Zn_{1-x}M_xO$ (wherein M is Mg, Ca, Zr, W, Li, Ti, or a combination thereof, and $0 \leq x < 0.5$).

For example, M may be Mg, Co, Ni, or a combination thereof, and x may be in a range of about $0.01 \leq x \leq 0.4$, about $0.02 \leq x \leq 0.4$, about $0.03 \leq x \leq 0.3$, or about $0.05 \leq x \leq 0.3$.

For example, the zinc oxide nanoparticle may have an average particle diameter, for example, greater than or equal to about 1 nm, greater than or equal to about 1.5 nm, greater than or equal to about 2 nm, greater than or equal to about 2.5 nm, or greater than or equal to about 3 nm, for example, less than or equal to about 10 nm, less than or equal to about 9 nm, less than or equal to about 8 nm, less than or equal to about 7 nm, less than or equal to about 6 nm, or less than or equal to about 5 nm.

For example, the zinc oxide nanoparticles may be ZnO nanoparticles, $Zn_{1-x}Mg_xO$ nanoparticles, or a combination thereof. The zinc oxide nanoparticles may not be in the form of rods or nanowires.

For example, a thickness of the third auxiliary layer 15 (e.g., each of electron injection layer, electron transport layer, or hole blocking layer) may be, for example greater than or equal to about 5 nm, greater than or equal to about 6 nm, greater than or equal to about 7 nm, greater than or equal to about 8 nm, greater than or equal to about 9 nm, greater than or equal to about 10 nm, greater than or equal to about 11 nm, greater than or equal to about 12 nm, greater than or equal to about 13 nm, greater than or equal to about 14 nm, greater than or equal to about 15 nm, greater than or equal to about 16 nm, greater than or equal to about 17 nm, greater than or equal to about 18 nm, greater than or equal to about 19 nm, or greater than or equal to about 20 nm, and for example less than or equal to about 120 nm, less than or equal to about 110 nm, less than or equal to about 100 nm, less than or equal to about 90 nm, less than or equal to about 80 nm, less than or equal to about 70 nm, less than or equal to about 60 nm, less than or equal to about 50 nm, less than or equal to about 40 nm, less than or equal to about 30 nm, or less than or equal to about 25 nm, but is not limited thereto.

Optionally, an additional layer (not shown) may be further included between the second electrode 16 and the quantum dot layer 14. For example, an additional layer may be further included between the second electrode 16 and the third auxiliary layer 15, or an additional layer may be further included between the third auxiliary layer 15 and the quantum dot layer 14.

An embodiment provides a method of manufacturing the aforementioned light emitting device.

The method of manufacturing the aforementioned light emitting device 10 includes forming first electrode 11 on a substrate (not shown), forming first auxiliary layer 12 on the first electrode 11, forming a second auxiliary layer 13 on the first auxiliary layer 12, forming a quantum dot layer 14 on the second auxiliary layer 13, forming a third auxiliary layer 15 on the quantum dot layer 14, and forming a second electrode 16 on the third auxiliary layer 15. In this case, the forming of the second auxiliary layer 13 and the forming of the third auxiliary layer 15 may be omitted.

The first auxiliary layer 12, second auxiliary layer 13, quantum dot layer 14 and third auxiliary layer 15 may be formed by a solution process, respectively, for example a spin coating, a slit coating, an inkjet printing, a nozzle printing, a spraying, a doctor blade coating, or a combination thereof, but is not limited thereto.

The forming of the first auxiliary layer 12 may be performed by a solution process, and may be performed by an example a spin coating, a spray coating, a slit coating, a dip coating, an inkjet printing, a nozzle printing, a doctor blade coating, or a combination thereof, but is not limited thereto.

For example, the forming of the auxiliary layer 12 may include obtaining the nickel oxide nanoparticles and organic ligand from a precursor mixture including a nickel oxide precursor and an organic ligand precursor, and obtaining a composition for a first auxiliary layer including the nickel oxide nanoparticles and organic ligand, and coating the composition for the first auxiliary layer.

The nickel oxide precursor may include nickel (II) acetylacetonate and in an embodiment may not include nickel (II) acetate, nickel nitrate, or a combination thereof.

For example, the organic ligand precursor may be a substituted or unsubstituted C1 to C10 alkylamine compound, a substituted or unsubstituted C2 to C10 carboxylic acid compound, or a combination thereof. Specifically, the substituted or unsubstituted C1 to C10 alkylamine compound, and the substituted or unsubstituted C2 to C10 carboxylic acid compound are the same as described herein.

For example, the organic ligand precursor may be a substituted or unsubstituted octylamine, a substituted or unsubstituted octanoic acid, or a combination thereof.

Optionally, the precursor mixture may further include a dopant precursor. The dopant precursor may include a metal of copper, aluminum, molybdenum, vanadium, iron, lithium, manganese silver, cobalt, zirconium, chromium, zinc, or a combination thereof and may include, for example, an acetylacetonate including the metal.

Optionally, the precursor mixture may further include a reaction catalyst.

In an embodiment, the precursor mixture may not include a separate dispersing agent to disperse the nickel oxide nanoparticles. For example, in an embodiment, the precursor mixture may not include an inorganic dispersing agent and an organic dispersing agent such as a metal salt in order to disperse metal nanoparticles. Accordingly, in an embodiment, the first auxiliary layer 12 prepared from the precursor mixture may not include a dispersing agent, and deterioration of driving characteristics caused by a dispersing agent of the light emitting device including the first auxiliary layer 12 may be decreased or prevented.

The dopant precursor in the precursor mixture may be present in an amount of about 1 mole percent (mol %) to about 20 mol %, for example, about 3 mol % to about 20 mol %, based on the total number of moles of the nickel oxide precursor and dopant precursor. When the precursor mixture includes the dopant precursor within the disclosed range, the first auxiliary layer 12 may be controlled to have sufficient electrical characteristics between the first electrode 11 and the quantum dot layer 14. If the precursor mixture includes the dopant precursor in an amount greater than the disclosed range, injection of holes moving from the first electrode 11 to the quantum dot layer 14, migration characteristics of holes moving from the first electrode 11 to the quantum dot layer 14, or a combination thereof may decrease.

Herein, the number of moles of the substituted or unsubstituted C1 to C10 alkylamine compound of the organic ligand precursor may be higher than that of substituted or unsubstituted C2 to C10 carboxylic acid compound.

For example, the obtaining of the nickel oxide nanoparticles and organic ligand may include, for example, heat-treating the precursor mixture at a temperature of less than or equal to about 150° C., less than or equal to about 140° C., less than or equal to about 130° C., less than or equal to about 125° C., or less than or equal to about 120° C. and may include for example heat-treating the same at a temperature of greater than or equal to about 50° C., greater than or equal to about 60° C., greater than or equal to about 70° C. greater than or equal to about 75° C., or greater than or equal to about 80° C. For example, the obtaining of the nickel oxide nanoparticles and organic ligand may include heat-treating the same at a temperature of about 50° C. to about 150° C., or about 80° C. to about 120° C.

For example, in an embodiment, the obtaining of the nickel oxide nanoparticles may not include a sol-gel process, which may include a high temperature process, and nickel oxide nanoparticles having a smaller average particle diameter and a more uniform distribution of a particle diameter at a relatively low temperature may be obtained.

For example, the nickel oxide nanoparticles and the organic ligand obtained from the precursor mixture including the nickel oxide precursor and organic ligand precursor may be bound, attached, or a combination thereof to each other. For example, the organic ligand may be bound, attached, or a combination thereof to the surface of the nickel oxide nanoparticles. Accordingly, the composition for the first auxiliary layer in which nickel oxide nanoparticles are not agglomerated may be formed even without a dispersing agent.

The composition for the first auxiliary layer may include a solvent, and the solvent, which should be capable of dispersing the organic ligand and nickel oxide nanoparticles, organic ligand, or a combination thereof, is not limited.

For example, when the organic ligand is derived from an unsubstituted C1 to C10 alkylamine compound or an unsubstituted C1 to C10 carboxylic acid compound, the solvent included in the composition for forming the first auxiliary layer may be an organic solvent. Herein, the organic solvent may include C5 to C16 alkane, for example, C6 to C10 alkane or C6 to C8 alkanes. By including the alkane in the carbon number range, the nickel oxide nanoparticles in the composition for the first auxiliary layer may be dispersed without agglomeration, and the amount of the organic ligand in the first auxiliary layer 12 may be controlled even by heat treatment at a relatively low temperature.

For example, the organic solvent included in the composition for forming the first auxiliary layer may be a substituted or unsubstituted hexane, a substituted or unsubstituted heptane, a substituted or unsubstituted octane, or a substituted or unsubstituted nonane, but is not limited thereto.

When the organic ligand is derived from a C1 to C10 alkylamine compound further including a hydrophilic substituent other than an amino group or an unsubstituted C1 to C10 carboxylic acid compound further including a hydrophilic substituent other than a carboxyl group, a solvent included in the composition for forming the first auxiliary layer may be a hydrophilic solvent. Herein, the hydrophilic solvent may include for example an alcohol solvent, for example methanol, ethanol, isopropanol, butanol, or a combination thereof.

For example, the coating the composition for the first auxiliary layer may include a spin coating, a spray coating, a slit coating, a dip coating, an inkjet printing, a nozzle printing, a doctor blade coating, or a combination thereof of the composition for the first auxiliary layer.

For example, the coating of the composition for the first auxiliary layer may include heat-treating at a temperature of less than or equal to about 500° C. less than or equal to about 450° C., less than or equal to about 400° C., less than or equal to about 350° C., less than or equal to about 320° C., less than or equal to about 300° C., less than or equal to about 270° C., less than or equal to about 250° C., less than or equal to about 230° C., less than or equal to about 220° C., less than or equal to about 210° C., or less than or equal to about 200° C.

According to an embodiment, a display device including the aforementioned light emitting device may be provided, and the light emitting device may be applied to not only a display device but also various electronic devices such as lighting devices, and the like.

Hereinafter, the embodiments are illustrated in more detail with reference to examples. However, these examples are exemplary, and the present scope is not limited thereto.

EXAMPLES

Synthesis Example: Synthesis of Quantum Dot (1) Synthesis of InP Core 0.2 millimoles (mmol) of Indium acetate, 0.6 mmol of palmitic acid, and 10 milliliters (mL) of 1-octadecene are put in a reactor and then, heated at 120° C. under vacuum. After 1 hour, an atmosphere in the reactor is converted into nitrogen. The reactor is heated at 280° C., a mixed solution of 0.1 mmol of tris(trimethylsilyl)phosphine (TMS3P) and 0.5 mL of trioctylphosphine is rapidly injected thereinto and then, reacted for 20 minutes. The reaction solution is rapidly cooled down to room temperature, acetone is added thereto and centrifuged, and then, precipitates obtained therefrom are dispersed in toluene to obtain InP toluene dispersion.

(2) Synthesis of InP Core/ZnS Shell Quantum Dot 0.3 mmoL (0.056 grams (g)) of zinc acetate, 0.6 mmol (0.189 g) of oleic acid, and 10 mL of trioctylamine are put in a reaction flask and then, vacuum-treated at 120° C. for 10 minutes. The reaction flask is internally substituted with $N_2$ and then, heated up to 220° C. Subsequently, the InP toluene dispersion (OD: 0.15) according to Synthesis Example and 0.6 mmol of S/TOP are put in the reaction flask and then, heated up to 280° C. and reacted for 30 minutes. When a reaction is complete, the reaction solution is rapidly cooled down to room temperature, an excessive amount of ethanol is added thereto and then, centrifuged to remove an extra organic material present in the quantum dot reactant. After the centrifugation, a supernatant is discarded, the precipitates are dissolved again in hexane, and an excessive amount of ethanol is added thereto and then, centrifuged again. The centrifuged precipitates are dried and dispersed again in octane to obtain InP/ZnS core shell quantum dot dispersion.

Preparation of Composition for First Auxiliary Layer (1) Preparation of Composition 1 for First Auxiliary Layer Nickel acetylacetonate ($C_{10}H_{14}NiO_4$, 1 mmol), octylamine ($C_8H_{19}N$, 15 mL), and octanoic acid ($C_8H_{16}O_2$, 1 mmol) are put in a reactor, vigorously stirred at 110° C. for 30 minutes, and then, cooled down to 90° C. Subsequently, a borane-triethyl complex (($(C_2H_5)_3NBH_3$, 2.4 mmol) is added thereto and then, reacted at 90° C. for 1 hour and cooled down to room temperature. 30 mL of ethanol is added thereto and then, centrifuged at 5,000 to 7,000 rpm to obtain NiO nanoparticles as precipitates. The obtained NiO nanoparticles are washed with ethanol and acetone and then, dispersed at a level of 0.5 to 50 milligrams per milliliter (mg/mL) in octane to prepare nickel oxide nanoparticle dispersion.

(2) Preparation of Composition 2 for First Auxiliary Layer

Nickel acetylacetonate ($C_{10}H_{14}NiO_4$, 0.9 mmol), copper (II) acetylacetonate ($C_{10}H_{14}CuO_4$, 0.1 mmol), octylamine ($C_8H_{19}N$, 5 mL), and octanoic acid (C8H16O2, 1 mmol) are put in a reactor and then, vigorously stirred at 110° C. for 30 minutes and cooled down to 90° C. Subsequently, a borane-triethyl complex (($(C_2H_5)_3NBH_3$, 2.4 mmol) is added thereto and then, reacted at 90° C. for 1 hour and cooled down to room temperature. 30 mL of ethanol is added thereto and then, centrifuged at 5,000 to 7,000 rpm to obtain NiO nanoparticles as precipitates. The obtained NiO nanoparticles are washed with ethanol and acetone and then, dispersed in octane at a level of 0.5 to 50 mg/mL to prepare Cu-doped nickel oxide nanoparticle dispersion.

(3) Preparation of Reference Composition for First Auxiliary Layer

Nickel acetylacetonate ($C_{10}H_{14}NiO_{4,\ 1}$ mmol), oleylamine ($C_{18}H_{37}N$, 15 mL), and oleic acid ($C_{18}H_{34}O_{2,\ 1}$ mmol) are put in a reactor and then, vigorously stirred at 110° C. for 30 minutes and cooled down to 90° C. Subsequently, a borane-triethyl complex (($(C_2H_5)3NBH_{3,\ 2.4}$ mmol) is added thereto and then, reacted at 90° C. for 1 hour and cooled down to room temperature. 30 mL of ethanol is added thereto and then, centrifuged at 5,000 to 7,000 rpm to obtain NiO nanoparticles as precipitates. The obtained NiO nanoparticles are washed with ethanol and acetone and then, dispersed in octane at a level of 0.5 to 50 mg/mL to prepare nickel oxide nanoparticle dispersion.

(4) Preparation of Comparative Composition for First Auxiliary Layer

Nickel oxide (NiO) nanoparticles are synthesized in a spray flame method. To prepare a precursor, 2-ethylhexanoic acid (1080 g, Sigma-Aldrich Co., Ltd.) and Ni-acetate 4-hydrate (269.2 g, Sigma-Aldrich Co., Ltd.) are heated and dissolved at 150° C. for 1 hour. Subsequently, tetrahydrofuran (540 g, Sigma-Aldrich Co., Ltd.) is added thereto to prepare a precursor mixture. Then, the precursor mixture is supplied in a spray nozzle (7 milliliters per minute (ml/min), a micro cyclic gear pump mzr-2900 manufactured by HNP microsystem GmbH) and dispersed by oxygen (15 liters per minute (L/min), PanGas Tech) and ignited with premixed methane-oxygen flame ($CH_4$: 1.2 L/min, $O_2$: 2.2 L/min). Subsequently, the discharged gas is filtered with a glass fiber filter (Schleicher & Schuell) by a vacuum pump (Seco SV1040CV, Busch) at about 20 cubic meters per hour ($m^3/h$) to obtain nickel oxide nanoparticle powders. The obtained nickel oxide nanoparticle powders are collected from the glass fiber filter.

5 weight percent (wt %) of the obtained nickel oxide nanoparticle powders, 0.1 wt % of yttrium (III) nitrate 6-hydrate (Sigma Aldrich Co., Ltd.), and 94.9 wt % of methanol (Merck Co., Inc.) are mixed to prepare a solution, and then, the solution is dispersed through ball-milling for 1 hour to prepare a comparative composition for a first auxiliary layer.

Manufacture of Thin Film

Preparation Example 1

100 microliters (μL) to 200 μL of the composition 1 for the first auxiliary layer is spin-coated on a glass plate and dried to obtain a 10 nanometers (nm) to 15 nm-thick thin film.

Preparation Example 2

The thin film of Preparation Example 1 is additionally heat-treated at 200° C. for 20 minutes to form a 10 nm to 15 nm-thick thin film.

Preparation Example 3

The thin film of Preparation Example 1 is additionally heat-treated at 500° C. for 60 minutes to form a 15 nm-thick thin film.

Preparation Example 4

100 μL to 200 μL of the composition 2 for a first auxiliary layer is spin-coated on a glass plate and dried to obtain a 10 nm to 15 nm-thick thin film.

Preparation Example 5

The thin film of Preparation Example 4 is additionally heat-treated at 200° C. for 20 minutes to form a 10 nm to 15 nm-thick thin film.

Preparation Example 6

The thin film of Preparation Example 4 is additionally heat-treated at 500° C. for 60 minutes to form a 10 nm to 15 nm-thick thin film.

Reference Preparation Example 1

100 μL to 200 μL of the reference composition for a first auxiliary layer is spin-coated on a glass plate and dried to obtain a 10 nm to 15 nm-thick thin film.

Reference Preparation Example 2

The thin film of Reference Preparation Example 1 is additionally heat-treated at 200° C. for 20 minutes to form a 10 nm to 15 nm-thick thin film.

Reference Preparation Example 3

The thin film of Reference Preparation Example 1 is additionally heat-treated at 500° C. for 60 minutes to form a 10 nm to 15 nm-thick thin film.

Comparative Preparation Example 1

100 μL to 200 μL of the composition 2 for a first auxiliary layer is spin-coated on a glass plate and dried to obtain a 10 nm to 15 nm-thick thin film.

Comparative Preparation Example 2

The thin film of Comparative Preparation Example 1 is additionally heat-treated at 200° C. for 20 minutes to form a 10 nm to 15 nm-thick thin film.

Comparative Preparation Example 3

The thin film of Comparative Preparation Example 1 is additionally heat-treated at 500° C. for 60 minutes to form a 10 nm to 15 nm-thick thin film.

Thin Film Evaluation I

Crystalline and morphology of the thin films of Preparation Examples and Reference Preparation Examples are evaluated.

The crystalline and morphology of the thin films are evaluated by using a transmission electron microscope (TEM, JEM-2100 Electron Microscope manufactured by JEOL Inc.) and a scanning electron microscope (SEM, JSM-7900F manufactured by JEOL Inc.).

Figure 2:
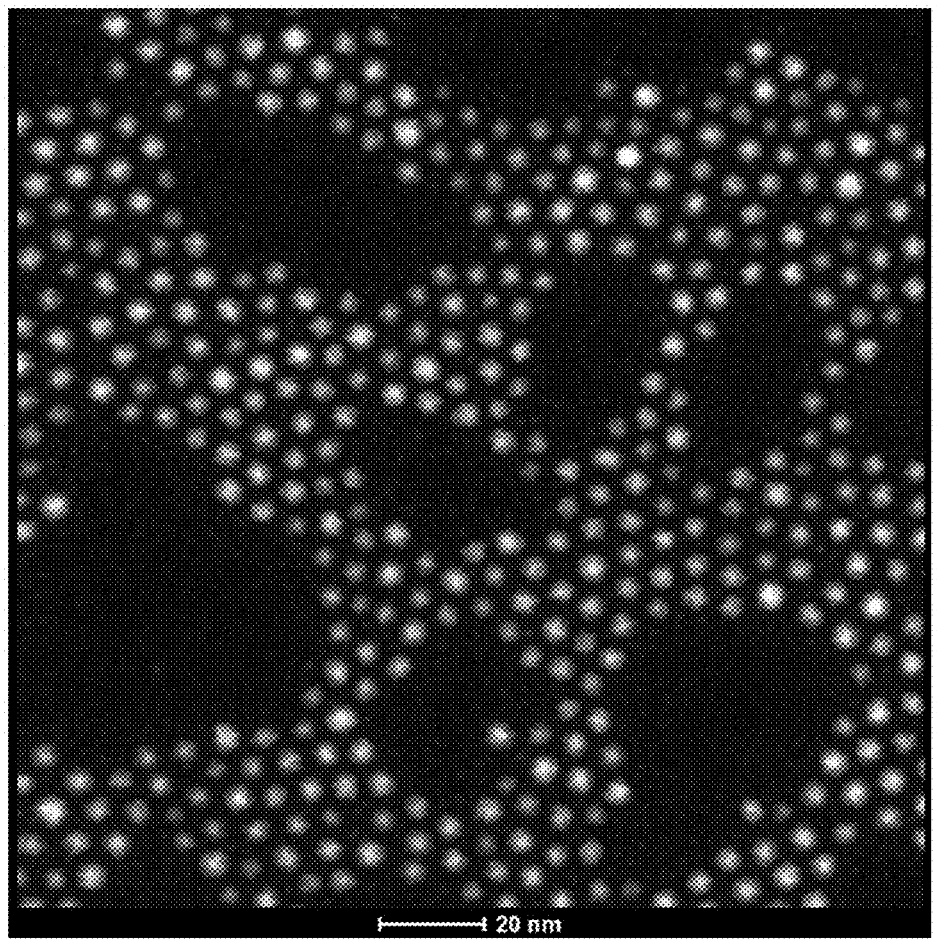
FIG. 2 is a transmission electron microscopic (TEM) image showing the morphology of the thin film of Preparation Example 1.
Figure 3:
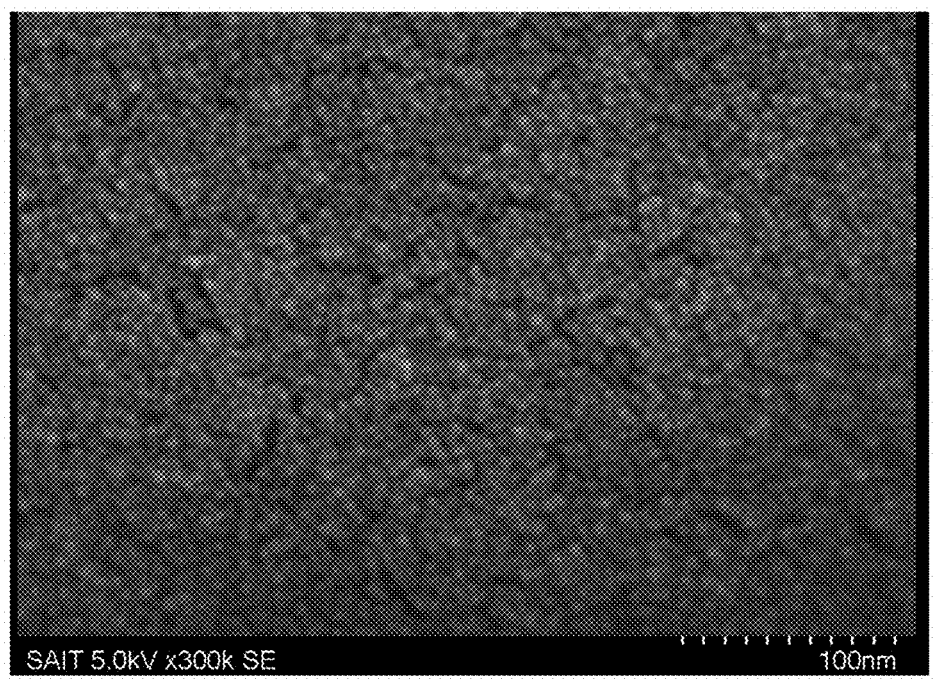
FIG. 3 is a transmission electron microscopic (TEM) image showing the morphology of the thin film of Preparation Example 2.
Figure 4:
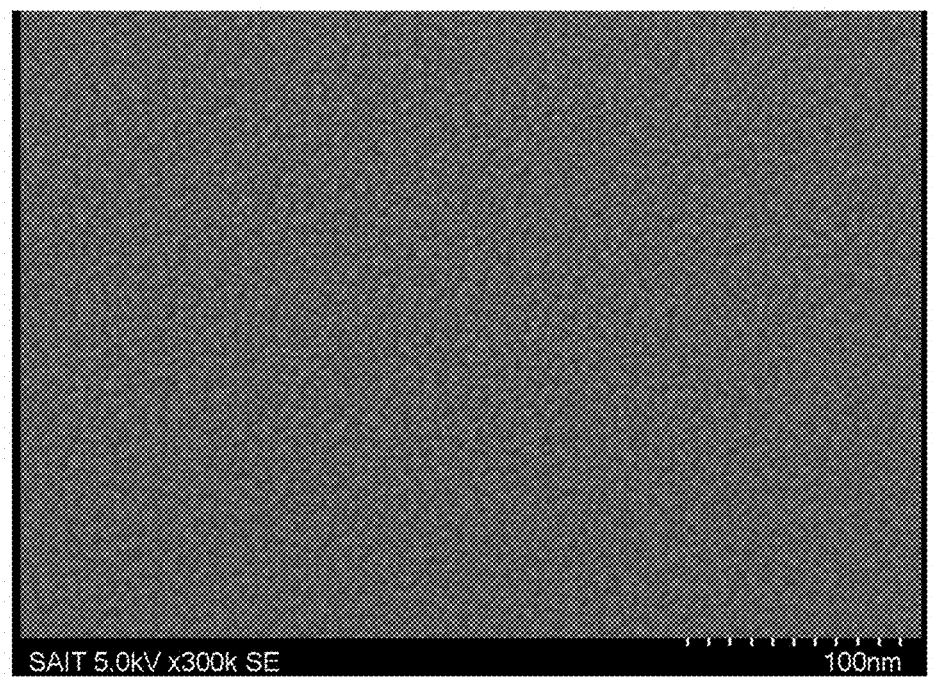
FIG. 4 is a scanning electron microscopic (SEM) image showing the morphology of the thin film of Reference Preparation Example 1.
Figure 5:
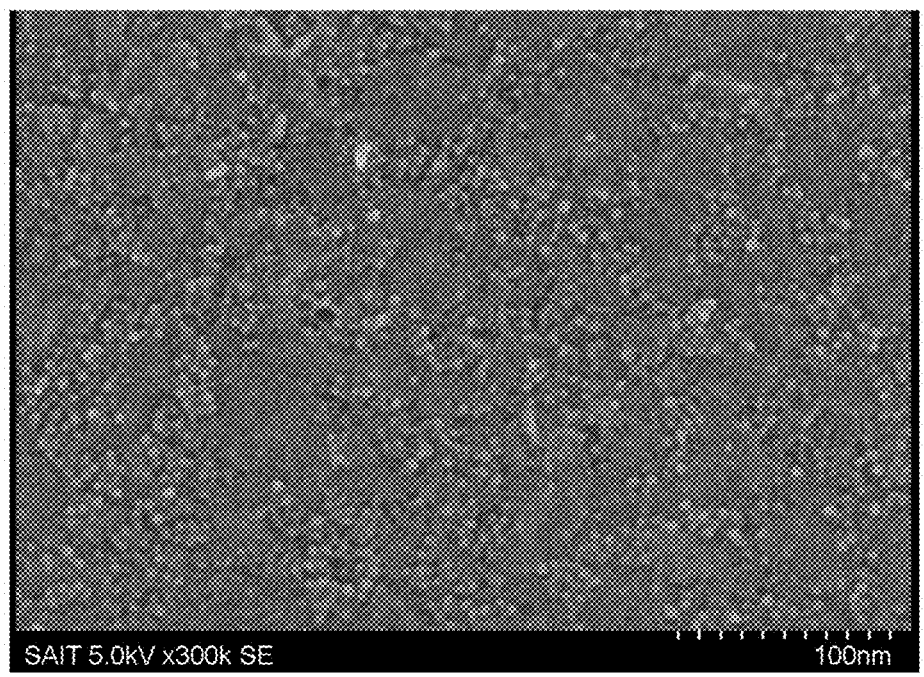
FIG. 5 is a scanning electron microscopic (SEM) image showing the morphology of the thin film of Reference Preparation Example 2.

FIG. 2 is a transmission electron microscopic (TEM) image showing the morphology of the thin film of Preparation Example 1, FIG. 3 is a transmission electron microscopic (TEM) image showing the morphology of the thin film of Preparation Example 2, FIG. 4 is a scanning electron microscopic (SEM) image showing the morphology of the thin film of Reference Preparation Example 1, and FIG. 5 is a scanning electron microscopic (SEM) image showing the morphology of the thin film of Reference Preparation Example 2.

In FIGS. 2 to 5, a relatively bright region indicates nickel oxide nanoparticles, but a relatively dark region indicates an organic ligand.

A plurality of nickel oxide nanoparticles included in the thin film has an average particle diameter obtained by randomly selecting a 100 nm×100 nm-sized square range in the TEM or SEM image of the thin films, measuring particle diameters of all the nickel oxide nanoparticles within the square range, and dividing a sum of the a particle diameters of the nickel oxide nanoparticles by the number of the nickel oxide particles.

Referring to FIGS. 2 to 5, the thin films of Preparation Examples 1 and 2 and Reference Preparation Examples 1 and 2 include a plurality of nickel oxide nanoparticles of less than or equal to about 10 nm, and the plurality of nickel oxide nanoparticles included in the thin film has a cubic crystal structure. Referring to FIG. 3, the thin film of Preparation Example 2 has a particle diameter within a narrow range of about 2 nm to 4 nm, and specifically, the nickel oxide nanoparticles turn out to have an average particle diameter of about 3.2 nm. In addition, greater than or equal to 90% of all the nickel oxide nanoparticles have an average particle diameter within a range of ±30% and a standard deviation of about 0.8 nm.

Accordingly, the thin films of Preparation Examples 1 and 2 and Reference Preparation Examples 1 and 2 include a plurality of nano particles having a relatively uniform particle size of less than about 5 nm.

In addition, the thin film of Preparation Example 2 includes less organic ligands and more uniformly distributed nickel oxide nanoparticles than the thin film of Reference Preparation Example 2.

Thin Film Evaluation II

Organic ligand amounts of the thin films of Preparation Examples and Reference Preparation Examples are evaluated.

The organic ligand amounts are evaluated through a thermogravimetric (TGA) analysis.

First, the organic ligand amounts of the thin films of Preparation Examples 1 and 4 and Reference Preparation Example 1 are evaluated. The organic ligand amounts are evaluated by respectively measuring weights (initial weights before a heat treatment) of the thin films of Preparation Examples 1 and 4 and Reference Preparation Example 1 and weights (weights after the heat treatment at 500° C.) of the thin films of Preparation Examples 3 and 6 and Reference Preparation Example 3 and then, calculating weight differences between them.

$$\text{Organic ligand amount (\%)} = \{(\text{Initial weight} - \text{Weight after heat treatment at } 500° \text{C.})/\text{Initial weight}\} \times 100\% \quad \text{Calculation Equation 1}$$

TABLE 1

| | Organic ligand amount (wt %) |
|---|---|
| Preparation Example 1 | 25.9 |
| Preparation Example 4 | 26.6 |
| Reference Preparation Example 1 | 38 |

Referring to Table 1, the thin films of Preparation Examples 1 and 4 include a lesser amount of organic ligand than that of the thin film of Reference Preparation Example 1.

Subsequently, weight changes depending on a temperature of the films of Preparation Examples 1 and 4 and Reference Preparation Example 1 are evaluated. Specifically, the weights (initial weights) of the thin films of Preparation Examples 1 and 4 and Reference Preparation Example 1 are respectively measured, and the weight changes of the films are measured while respectively heated up to 600° C.

Figure 6:
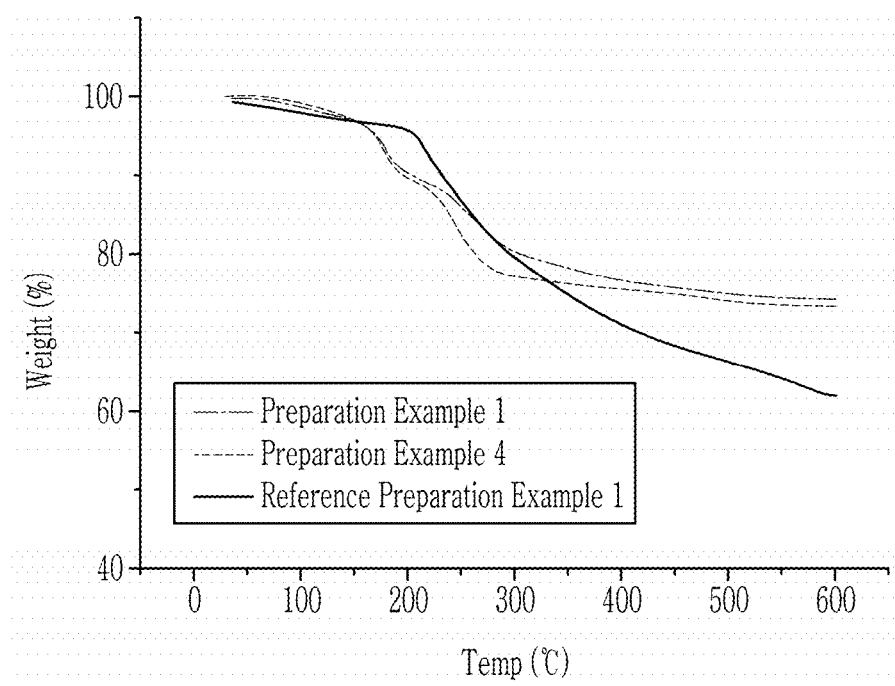
FIG. 6 is a graph of weight (percent (%)) versus temperature (Temp) (° C.) of the thin film of Preparation Example 1, Preparation Example 4, and Reference Preparation Example 1.

FIG. 6 is a temperature-weight variation ratio graph showing weight variation ratios depending on a temperature of the thin films of Preparation Examples 1 and 4 and Reference Preparation Example 1.

The weight variation ratios are calculated according to Calculation Equation 2.

$$\text{Weight variation (\%)} = (\text{weight after heat treatment}/\text{initial weight}) \times 100\% \quad \text{Calculation Equation 2}$$

Figure 8:
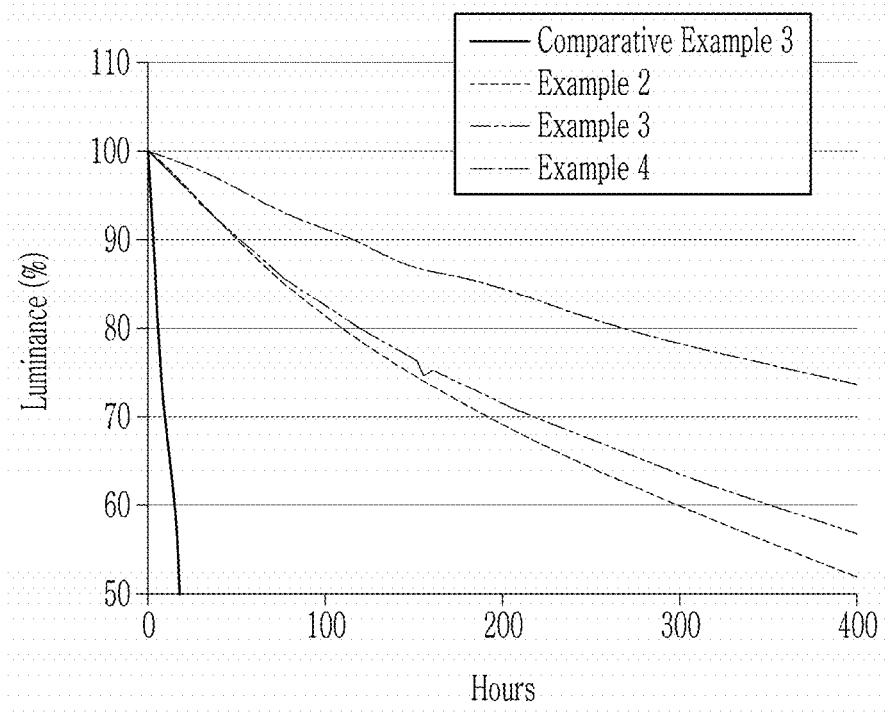
FIG. 8 is a graph of luminance (%) versus hours showing life-span characteristics of the light emitting devices of Example 2 to Example 4 and Comparative Example 3.

Referring to FIG. 8, the thin films of Preparation Examples 1 and 4 exhibit a great weight decrease at less than or equal to 200° C., but the thin film of Reference Preparation Example 1 exhibits no great weight change at a less than or equal to 200° C. Accordingly, since the organic ligand amount of the thin films of Preparation Examples 1 and 4 is sufficiently decreased at a low temperature compared with the thin film of Reference Preparation Example 1 to obtain a light emitting device easily-applicable at a lower temperature.

Device Example I: Manufacture of Light Emitting Device 1

Example 1

An indium-tin oxide (ITO) layer is deposited on a glass substrate, and the composition 1 for a first auxiliary layer is spin-coated and heat-treated at 200° C. for 20 minutes to form a 13 nm-thick first auxiliary layer. On the first auxiliary layer, poly[(9,9-dioctylfluorenyl-2,7-diyl-co (4,4'-(N-4-butylphenyl)diphenylamine] (TFB, Sumitomo Chemical Co., Ltd.) is dissolved to be 0.1 to 1 wt % in ortho-xylene (o-xylene), and the solution is spin-coated and then, heat-treated at 150° C. for 30 minutes to form a 10 nm-thick second auxiliary layer. On the second auxiliary layer, the InP/ZnS core shell quantum dot according to Synthesis Example is spin-coated and then, heat-treated at 90° C. to 120° C. for 30 minutes to form a 20 nm-thick quantum dot layer. Thereon, $Zn_{85}Mg_{15}O$ nanoparticles (an average particle diameter: 3 to 7 nm) are dissolved in ethanol, and $Zn_{85}Mg_{15}O$ dispersion (10 to 100 mg/mL) obtained therefrom is spin-coated and then, heat-treated at 120° C. for 30 minutes to form a third auxiliary layer. Subsequently, a 100 nm-thick aluminum thin film is deposited through sputtering to manufacture a light emitting device.

Reference Example 1

A light emitting device is manufactured according to the same method as Example 1 except that the reference composition for a first auxiliary layer is used instead of the composition 1 for a first auxiliary layer.

Comparative Example 1

A light emitting device is manufactured according to the same method as Example 1 except that the first auxiliary layer is not formed.

Comparative Example 2

A light emitting device is manufactured according to the same method as Example 1 except that comparative composition for a first auxiliary layer is spin-coated and heat-treated at 400° C. for 20 minutes instead of spin-coating and then, heat-treating the composition 1 for a first auxiliary layer at 200° C. for 20 minutes.
Light Emitting Device Evaluation I Luminance characteristics and electrical characteristics of the light emitting devices of Example 1, Reference Example 1, and Comparative Example 2.

The luminance characteristics and electrical characteristics are evaluated by using a Keithley 220 current source and a Minolta CS200 spectroradiometer.

The results are shown in Table 2.

TABLE 2

|  | $EQE_{max}$ | Maximum luminance (candelas per square meter ($cd/m^2$)) | Maximum current efficiency (candela/ampere (cd/A)) | V@1000 nit (volts (V)) |
|---|---|---|---|---|
| Example 1 | 5.1 | 47220 | 4.1 | 7.4 |
| Reference Example 1 | 1.5 | 13240 | 1.3 | 9.6 |
| Comparative Example 2 | 1.0 | 580 | — | — |

* $EQE_{max}$: maximum external quantum efficiency
* V@1000 nt: voltage at 1000 nit ($cd/m^2$)

Referring to Table 2, the light emitting device of Example 1 exhibits excellent electrical characteristics and luminance characteristics such as $EQE_{max}$, maximum luminance, maximum current efficiency, V@1000nit, and the like in terms of luminance performance, compared with those of Reference Example 1 and Comparative Example 2.
Light Emitting Device Evaluation II Life-span characteristics of the light emitting devices of Example 1 and Comparative Example 2 are evaluated.

The life-span characteristics are evaluated by driving the light emitting devices of Example 1 and Comparative Example 2 for 600 hours and measuring luminance changes thereof. The results are shown in Table 3 and FIG. 7.

Figure 7:
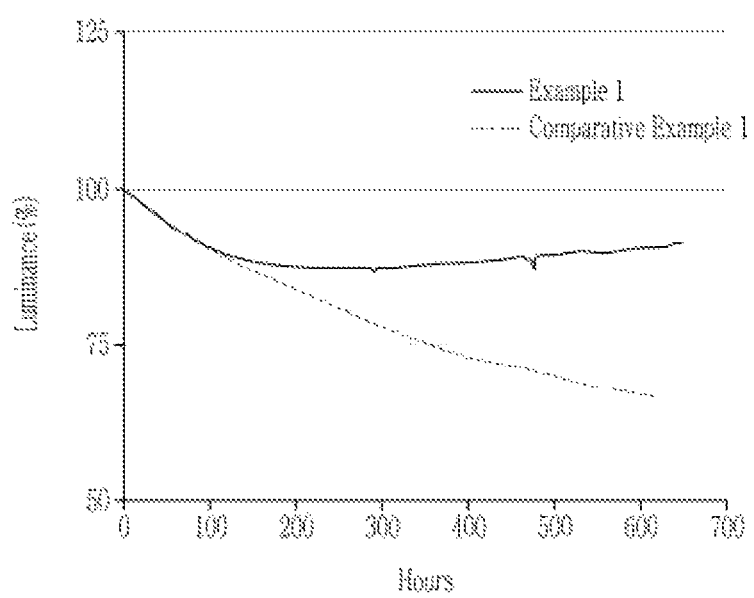
FIG. 7 is a graph of luminance (%) versus hours showing life-span characteristics of the light emitting devices of Example 1 and Comparative Example 1.

FIG. 7 is a graph showing life-span characteristics of the light emitting devices of Example 1 and Comparative Example 1.

TABLE 3

|  | T95 (hours) | luminance decrease (%) after 600 hours |
|---|---|---|
| Example 1 | 48 | 10 |
| Comparative Example 1 | 5.6 | 34 |

* T95: time when luminance is reduced down to 95% of initial luminance

Referring to Table 3 and FIG. 7, the light emitting device of Example 1 exhibits improved life-span characteristics compared with the light emitting device according to Comparative Example 1.

Device Example II: Manufacture of Light Emitting Device 2

Example 2

A light emitting device is manufactured according to the same method as Example 1 except that poly(9-vinylcarbazole) (PVK) instead of the poly[(9,9-dioctylfluorenyl-2,7-diyl-co (4,4'-(N-4-butylphenyl)diphenylamine] (TFB, Sumitomo Chemical Co., Ltd.) is dissolved to be 0.1 to 1 wt % in o-xylene, and the solution is heat-treated at 150° C. to 200° C. for 30 minutes to form a 10 nm-thick second auxiliary layer.

Example 3

A light emitting device is manufactured according to the same method as Example 2 except that the surface of the first auxiliary layer is treated for one minute with a solution prepared by dissolving $ZnCl_2$ at a concentration of 50 mg/mL in ethanol before forming the second auxiliary layer.

Example 4

A light emitting device is manufactured according to the same method as Example 2 except that the surface of the first auxiliary layer is treated for one minute with a solution prepared by dissolving tetramethylammonium hydroxide (TMAH) at a concentration of 50 mg/mL in ethanol before forming the second auxiliary layer.

Comparative Example 3

A light emitting device is manufactured according to the same method as Example 1 except that a 13 nm-thick first auxiliary layer is formed by dissolving poly(3,4-ethylene-dioxythiophene) (PEDOT) to be 0.5 wt % in o-xylene and then, spin-coating and heat-treating the solution at 150° C. for 30 minutes instead of spin-coating the composition for the first auxiliary layer 1 and heat-treating it at 200° C. for 20 minutes to form, and a 10 nm-thick second auxiliary layer is formed by dissolving poly(9-vinylcarbazole) (PVK) to 0.5 wt % in o-xylene and spin-coating the solution and heat-treating it at 150° C. for 30 minutes instead of dissolving the poly[(9,9-dioctylfluorenyl-2,7-diyl-co (4,4'-(N-4-butylphenyl)diphenylamine] (TFB, Sumitomo Chemical Co., Ltd.) to be 0.5% in o-xylene and then, spin-coating the solution and heat-treating it at 150° C. to 200° C. for 30 minutes.

Light Emitting Device Evaluation III

Life-span characteristics of the light emitting devices of Examples 2 to 4 and Comparative Example 3 are evaluated.

The life-span characteristics are evaluated by driving the light emitting devices of Examples 2 to 4 and Comparative Example 3 for 400 hours and measuring luminance changes thereof. The results are shown in FIGS. 8 and 9.

Figure 9:
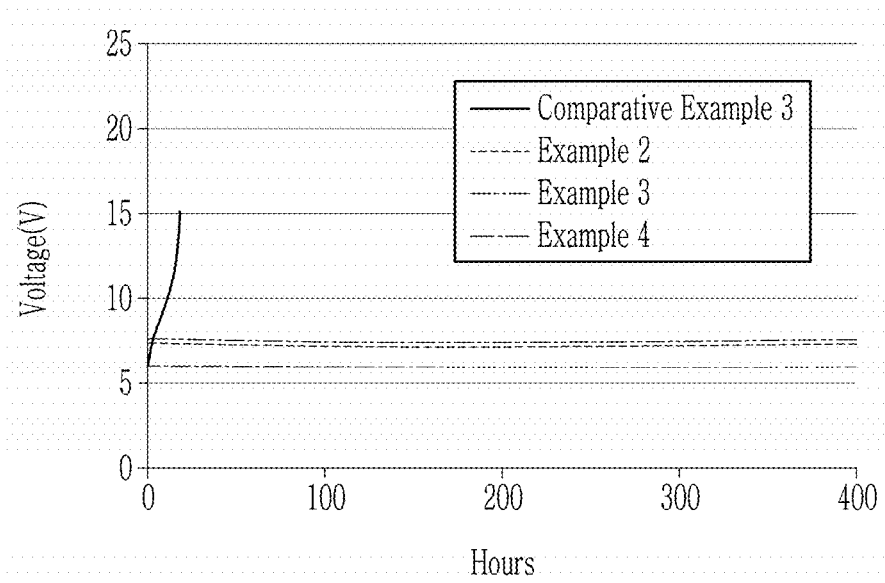
FIG. 9 is a graph of voltage (volts (V)) versus hours showing life-span characteristics of the light emitting devices of Example 2 to Example 4 and Comparative Example 3.

FIGS. 8 and 9 are graphs showing life-span characteristics of the light emitting devices of Examples 2 to 4 and Comparative Example 3.

Referring to FIGS. 8 and 9, the light emitting devices of Examples 2 to 4 exhibit improved life-span characteristics compared with the light emitting device according to Comparative Example 3.

Device Example III: Manufacture of HOD (Hole Only Device)

Example 5

An indium-tin oxide (ITO) layer is deposited on a glass substrate, and the composition 1 for a first auxiliary layer is spin coated and heat treated at 200° C. for 20 minutes to form a 13 nm-thick first auxiliary layer. Thereon, the InP/ZnS core shell quantum dot according to Synthesis Example is spin-coated and then, heat-treated at 80° C. to 130° C. for 30 minutes to form a 20 nm-thick quantum dot layer. On the quantum dot layer, GSH0137 (Novaled GmbH) is deposited at 400 to 550° C. to form a 36 nm-thick GSH layer. On the GSH layer, L101 (LG Chem) is deposited at 400 to 550° C. to form a 10 nm-thick L101 layer. Subsequently, a 100 nm-thick aluminum thin film is sputtered and deposited to manufacture a light emitting device.

Example 6

On a glass substrate, an indium-tin oxide (ITO) layer is deposited, and the composition 1 for a first auxiliary layer is spin coated thereon and heat-treated at 200° C. for 20 minutes to form a 13 nm-thick first auxiliary layer. Then, a 100 nm-thick aluminum thin film is sputtered and deposited to manufacture a sample device.

Example 7

A light emitting device is manufactured according to the same method as Example 6 except that the composition 2 for a first auxiliary layer is used instead of the composition 1 for a first auxiliary layer.

Reference Example 2

A light emitting device is manufactured according to the same method as Example 2 except that the reference composition for a first auxiliary layer is used instead of the composition 1 for a first auxiliary layer.

Reference Example 3

A light emitting device is manufactured according to the same method as Example 3 except that the reference composition for a first auxiliary layer is used instead of the composition 1 for a first auxiliary layer.

HOD Device Evaluation I

Electrical characteristics of the HOD devices of Example 5 and Reference Example 2 are evaluated.

The electrical characteristics are evaluated by using a Keithley 220 current source and a Minolta CS200 spectroradiometer and then, measuring a current (milliamperes (mA)) at a voltage of 8 V.

The results are shown in Table 4.

TABLE 4

|  | Current (mA) |
| --- | --- |
| Example 5 | 0.84 |
| Reference Example 2 | 0.09 |

Referring to Table 4, the thin film of Example 5 has excellent electrical characteristics compared with the thin film of Reference Example 2.

HOD Device Evaluation II

Electrical characteristics of the thin films of Examples 6 and 7 and Reference Example 3 are evaluated.

The electrical characteristics are evaluated by using a Keithley 220 current source and a Minolta CS200 spectroradiometer and then, measuring a current (mA) at a voltage of 8 V.

The results are shown in Table 5.

TABLE 5

|  | Current (mA) |
| --- | --- |
| Example 6 | 144 |
| Example 7 | 520 |
| Reference Example 3 | 14 |

Referring to Table 5, the thin films of Examples 6 and 7 have more excellent electrical characteristics than that of Reference Example 3.

While this disclosure has been described in connection with what is presently considered to be practical example embodiments, it is to be understood that the invention is not limited to the disclosed embodiments. On the contrary, it is intended to cover various modifications and equivalent arrangements included within the spirit and scope of the appended claims.

What is claimed is:

1. A light emitting device comprising
a first electrode,
a second electrode,
a quantum dot layer disposed between the first electrode and the second electrode, and a first auxiliary layer disposed between the quantum dot layer and the first electrode,
wherein the first auxiliary layer comprises nickel oxide nanoparticles having an average particle diameter of less than or equal to about 10 nanometers and an organic ligand.

2. The light emitting device of claim 1, wherein the average particle diameter of the nickel oxide nanoparticles is less than about 5 nanometers.

3. The light emitting device of claim 1, wherein about 90% or greater of a total number of the nickel oxide nanoparticles in the first auxiliary layer have a particle size within ±about 30% of the average particle diameter of the nickel oxide nanoparticles.

4. The light emitting device of claim 1, wherein the nickel oxide nanoparticles comprise a metal dopant other than nickel.

5. The light emitting device of claim 4, wherein the metal dopant comprises copper, aluminum, molybdenum, vanadium, iron, lithium, manganese, silver, cobalt, zirconium, chromium, zinc, or a combination thereof.

6. The light emitting device of claim 4, wherein the metal dopant is present in an amount of less than or equal to about 20 weight percent, based on a total weight of the nickel oxide nanoparticles.

7. The light emitting device of claim 1, wherein the organic ligand is derived from a substituted or unsubstituted C1 to C10 alkylamine compound, a substituted or unsubstituted C2 to C10 carboxylic acid compound, or a combination thereof.

8. The light emitting device of claim 1, wherein the organic ligand is derived from a substituted or unsubstituted pentylamine, a substituted or unsubstituted hexylamine, a substituted or unsubstituted heptylamine, a substituted or unsubstituted octylamine, a substituted or unsubstituted nonylamine, a substituted or unsubstituted pentanoic acid, a substituted or unsubstituted hexanoic acid, a substituted or unsubstituted heptanoic acid, a substituted or unsubstituted octanoic acid, a substituted or unsubstituted nonanoic acid, or a combination thereof.

9. The light emitting device of claim 1, wherein the organic ligand is present in an amount of less than or equal to about 30 weight percent, based on a total weight of the first auxiliary layer.

10. The light emitting device of claim 1, wherein the light emitting device further comprises a second auxiliary layer disposed between the first auxiliary layer and the quantum dot layer.

11. The light emitting device of claim 10, wherein the second auxiliary layer comprises poly(9,9-dioctyl-fluorene-co-N-(4-butylphenyl)-diphenylamine, polyarylamine, poly (N-vinylcarbazole), poly(3,4-ethylenedioxythiophene), poly (3,4-ethylenedioxythiophene) polystyrene sulfonate, polyaniline, polypyrrole, N,N,N',N'-tetrakis (4-methoxyphenyl)-benzidine, 4-bis[N-(1-naphthyl)-N-phenyl-amino]biphenyl, 4,4',4"-tris[phenyl(mtolyl)amino]triphenylamine, 4,4',4"-tris(N-carbazolyl)-triphenylamine, 1,1-bis[(di-4-tolylamino)phenylcyclohexane, a p-type metal oxide, graphene oxide, or a combination thereof.

12. The light emitting device of claim 1, wherein the light emitting device further comprises a third auxiliary layer disposed between the quantum dot layer and the second electrode, and
the second electrode and the third auxiliary layer comprise zinc oxide nanoparticles represented by $Zn_{1-x}M_xO$, wherein M is Mg, Ca, Zr, W, Li, Ti, or a combination thereof and $0 \leq x < 0.5$.

13. The light emitting device of claim 1, wherein
the first electrode comprises an anode,
the second electrode comprises a cathode,
the quantum dot layer comprises a light emitting layer comprising a non-cadmium-based quantum, and
the first auxiliary layer comprises a hole auxiliary layer.

14. A method of manufacturing a light emitting device, comprising
providing a first electrode,
forming a first auxiliary layer comprising nickel oxide nanoparticles having an average particle diameter of less than or equal to about 10 nanometers and an organic ligand on the first electrode,
forming a quantum dot layer on the first auxiliary layer, and
forming a second electrode on the quantum dot layer to manufacture the light emitting device.

15. The method of claim 14, wherein the forming of the first auxiliary layer is performed by a solution process.

16. The method of claim 14, wherein the forming of the first auxiliary layer comprises
obtaining the nickel oxide nanoparticles and the organic ligand from a precursor mixture comprising a nickel oxide precursor and an organic ligand precursor,
obtaining a composition for a first auxiliary layer comprising the nickel oxide nanoparticles and the organic ligand, and
coating the composition for the first auxiliary layer to form the first auxiliary layer.

17. The method of claim 16, wherein the organic ligand precursor comprises a substituted or unsubstituted C1 to C10 alkylamine compound, a substituted or unsubstituted C2 to C10 carboxylic acid compound, or a combination thereof.

18. The method of claim 16, wherein the organic ligand precursor comprises a substituted or unsubstituted pentylamine, a substituted or unsubstituted hexylamine, a substituted or unsubstituted heptylamine, a substituted or unsubstituted octylamine, a substituted or unsubstituted nonylamine, a substituted or unsubstituted pentanoic acid, a substituted or unsubstituted hexanoic acid, a substituted or unsubstituted heptanoic acid, a substituted or unsubstituted octanoic acid, a substituted or unsubstituted nonanoic acid, or a combination thereof.

19. The method of claim 16, wherein the obtaining the nickel oxide nanoparticles and the organic ligand comprises heat treating the precursor mixture at a temperature of less than or equal to about 150° C.

20. The method of claim 16, wherein the coating of the composition for the first auxiliary layer comprises coating the composition for the first auxiliary layer by a spin coating, a spray coating, a slit coating, a dip coating, an inkjet printing, a nozzle printing, a doctor blade coating, or a combination thereof.

21. The method of claim 16, wherein the coating of the composition for the first auxiliary layer comprises heat-treating at a temperature of less than 500° C.

22. A display device comprising the light emitting device of claim 1.

* * * * *